United States Patent
Kim et al.

(10) Patent No.: US 11,996,420 B2
(45) Date of Patent: May 28, 2024

(54) IMAGE SENSOR COMPRISING A GRID PATTERN AND A CONDUCTIVE PATTERN

(71) Applicant: SAMSUNG ELECTRONICS CO., LTD., Suwon-si (KR)

(72) Inventors: Han Seok Kim, Seoul (KR); Byung Jun Park, Yongin-si (KR); Hyeon Ho Kim, Hwaseong-si (KR); Young Woo Chung, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 400 days.

(21) Appl. No.: 17/405,517

(22) Filed: Aug. 18, 2021

(65) Prior Publication Data
US 2022/0109016 A1 Apr. 7, 2022

(30) Foreign Application Priority Data
Oct. 6, 2020 (KR) .................. 10-2020-0128468

(51) Int. Cl.
*H01L 27/146* (2006.01)

(52) U.S. Cl.
CPC .. *H01L 27/14603* (2013.01); *H01L 27/14621* (2013.01); *H01L 27/14627* (2013.01); *H01L 27/1463* (2013.01); *H01L 27/14636* (2013.01); *H01L 27/1464* (2013.01); *H01L 27/14645* (2013.01); *H01L 27/14683* (2013.01)

(58) Field of Classification Search
CPC ......... H01L 27/14603; H01L 27/14627; H01L 27/14621; H01L 27/14645; H01L 27/1463
See application file for complete search history.

(56) References Cited

U.S. PATENT DOCUMENTS

| | | | |
|---|---|---|---|
| 9,299,740 B2 | 3/2016 | Tseng et al. | |
| 9,741,756 B2 | 8/2017 | Ahn et al. | |
| 9,985,072 B1 | 5/2018 | Wen et al. | |
| 11,810,933 B2* | 11/2023 | Hsieh | H01L 27/14683 |
| 2014/0339665 A1* | 11/2014 | Tani | G02B 5/201 |
| | | | 257/432 |
| 2019/0157329 A1 | 5/2019 | Kim et al. | |

(Continued)

FOREIGN PATENT DOCUMENTS

KR 10-0781545 B1 12/2007

OTHER PUBLICATIONS

IP.com npl search (Year: 2024).*

Primary Examiner — William B Partridge
Assistant Examiner — David Paul Sedorook
(74) Attorney, Agent, or Firm — Sughrue Mion, PLLC

(57) ABSTRACT

An image sensor is provided. An image sensor includes: a substrate including an active pixel sensor region, an optical black sensor region, and a boundary region provided between the active pixel sensor region and the optical black sensor region; a photoelectric conversion element provided inside the substrate on the boundary region; a passivation layer provided on the substrate; a grid trench formed on the boundary region of the substrate and extending from an upper surface of the passivation layer toward an inside of the passivation layer; grid patterns, each of the grid patterns being provided on the passivation layer on each of the active pixel sensor region and the boundary region of the substrate, at least a part of a grid pattern being provided inside the grid trench; and a color filter provided between the grid patterns.

20 Claims, 29 Drawing Sheets

(56) References Cited

U.S. PATENT DOCUMENTS

| | | | |
|---|---|---|---|
| 2019/0221597 A1* | 7/2019 | Noh | H01L 27/14645 |
| 2019/0386049 A1* | 12/2019 | Jung | H01L 27/1463 |
| 2020/0119072 A1 | 4/2020 | Lim | |
| 2020/0127030 A1* | 4/2020 | Ogawa | H01L 27/14627 |
| 2020/0144320 A1 | 5/2020 | Seo et al. | |
| 2021/0343770 A1* | 11/2021 | Nishikido | H01L 27/14627 |

\* cited by examiner

IMAGE SENSOR COMPRISING A GRID PATTERN AND A CONDUCTIVE PATTERN

CROSS-REFERENCE TO RELATED APPLICATION

This application claims priority from Korean Patent Application No. 10-2020-0128468, filed on Oct. 6, 2020 in the Korean Intellectual Property Office, the disclosure of which is incorporated herein by reference in its entirety.

BACKGROUND

1. Field

Example embodiments of the present disclosure relate to an image sensor.

2. Description of Related Art

An image sensor is a semiconductor element that converts optical information into an electric signal. Such an image sensor may include a charge coupled device (CCD) image sensor and a complementary metal-oxide semiconductor (CMOS) image sensor.

The image sensor may be configured in the form of a package, and the package may be configured as a structure that protects the image sensor and allows light to enter a photo receiving surface or a sensing region of the image sensor.

Recently, a backside illumination (BSI), in which incident light is radiated through a back side of a semiconductor substrate so that pixels formed in the image sensor have improved light reception efficiency and light sensitivity, has been studied.

SUMMARY

One or more example embodiments of the present disclosure provide to an image sensor that reduces an occurrence of stain defects, by forming a grid trench between an active pixel sensor region and an optical black sensor region to reduce a step of a grid pattern.

According to an aspect of an example embodiment, there is provided an image sensor including: a substrate including an active pixel sensor region, an optical black sensor region, and a boundary region provided between the active pixel sensor region and the optical black sensor region; a photoelectric conversion element provided inside the substrate on the boundary region; a passivation layer provided on the substrate; a grid trench formed on the boundary region of the substrate and extending from an upper surface of the passivation layer toward an inside of the passivation layer; grid patterns, each grid pattern being provided on the passivation layer on each of the active pixel sensor region and the boundary region of the substrate, at least a part of a grid pattern being provided inside the grid trench; and a color filter provided between the grid patterns.

According to an aspect of an example embodiment, there is provided an image sensor including: a substrate; a photoelectric conversion element being provided inside the substrate; a passivation layer provided on the substrate; a grid trench extending from an upper surface of the passivation layer toward an inside of the substrate; a grid pattern provided on the passivation layer and at least partially provided inside the grid trench; and a conductive pattern provided on the passivation layer and at least partially provided inside the grid trench, the conductive pattern being in contact with a side wall of the grid pattern, wherein a first height in a vertical direction of the grid pattern provided on the upper surface of the passivation layer is smaller than a second height in the vertical direction of the grid pattern which overlaps the grid trench in the vertical direction.

According to an aspect of an example embodiment, there is provided an image sensor including: a substrate including an active pixel sensor region, an optical black sensor region, and a boundary region provided between the active pixel sensor region and the optical black sensor region; a photoelectric conversion element provided inside the substrate on the boundary region; a passivation layer provided on the substrate; a grid trench formed on the boundary region of the substrate and extending from an upper surface of the passivation layer toward an inside of the substrate; a grid pattern provided on the passivation layer on each of the active pixel sensor region of the substrate and the boundary region of the substrate, at least a part of the grid pattern being provided inside the grid trench; a conductive pattern provided on the passivation layer on each of the boundary region and the optical black sensor region of the substrate, the conductive pattern being at least partially provided inside the grid trench, and being in contact with a side wall of the grid pattern; a color filter provided between grid patterns and provided on the active pixel sensor region of the substrate; a microlens provided on the color filter; and an element isolation film provided between photoelectric conversion elements inside the substrate, the element isolation film being in contact with the grid pattern, wherein a first height in a vertical direction of the grid pattern provided on the upper surface of the passivation layer is smaller than a second height in the vertical direction of the grid pattern which overlaps the grid trench in the vertical direction.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION

Figure 1:
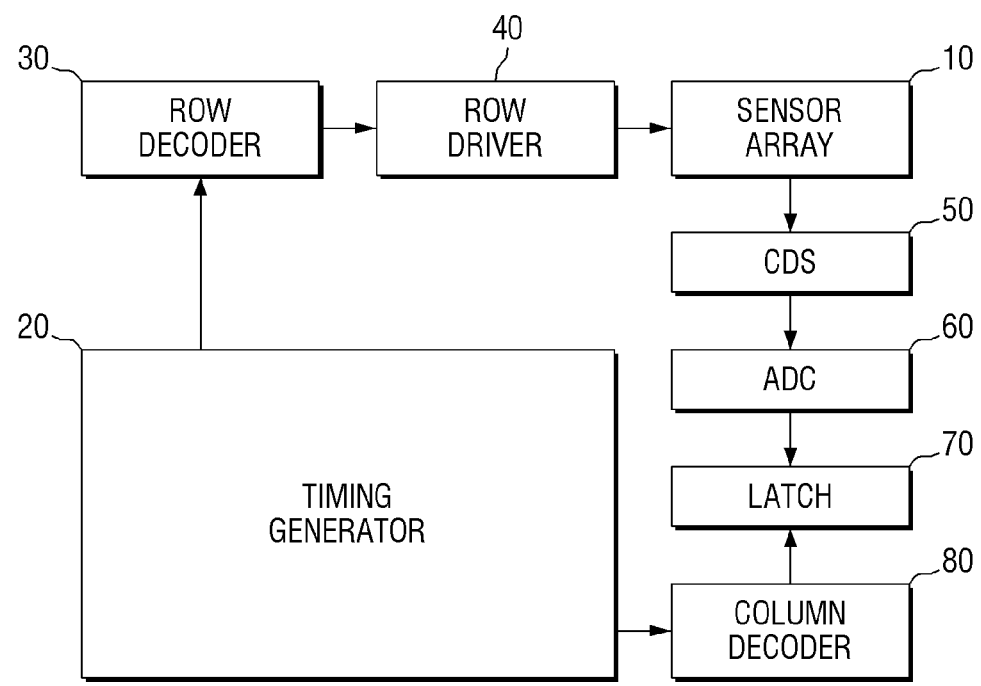
FIG. 1 is a block diagram of an image sensor according to some example embodiments.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects of the disclosure.

As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments are described in detail with reference to the accompanying drawings. In the drawings, like reference numerals denote like constituent elements, and the size of each constituent element may be exaggerated for clarity and convenience of explanation. The below-described embodiments are merely examples, and various modifications are possible from the example embodiments.

When a constituent element is disposed "above" or "on" to another constituent element, the constituent element may include not only an element directly contacting on a side (e.g., upper, lower, left, or right side) of the other constituent element, but also an element disposed above, under, left, or right the other constituent element in a non-contact manner. An expression used in a singular form in the specification also includes the expression in its plural form unless clearly specified otherwise in context. Also, terms such as "include" or "comprise" may be construed to denote a certain constituent element, but may not be construed to exclude the existence of or a possibility of addition of one or more other constituent elements.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps.

Furthermore, terms such as "-portion," "-unit," "-module," and "-block" stated in the specification may signify a unit to process at least one function or operation and the unit may be embodied by hardware, software, or a combination of hardware and software.

Furthermore, the connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language (e.g., "such as") provided herein, is intended merely to better illuminate the disclosure and does not pose a limitation on the scope of the disclosure unless otherwise claimed.

An image sensor according to some example embodiments will be explained referring to FIGS. 1 to 6.

Figure 2:
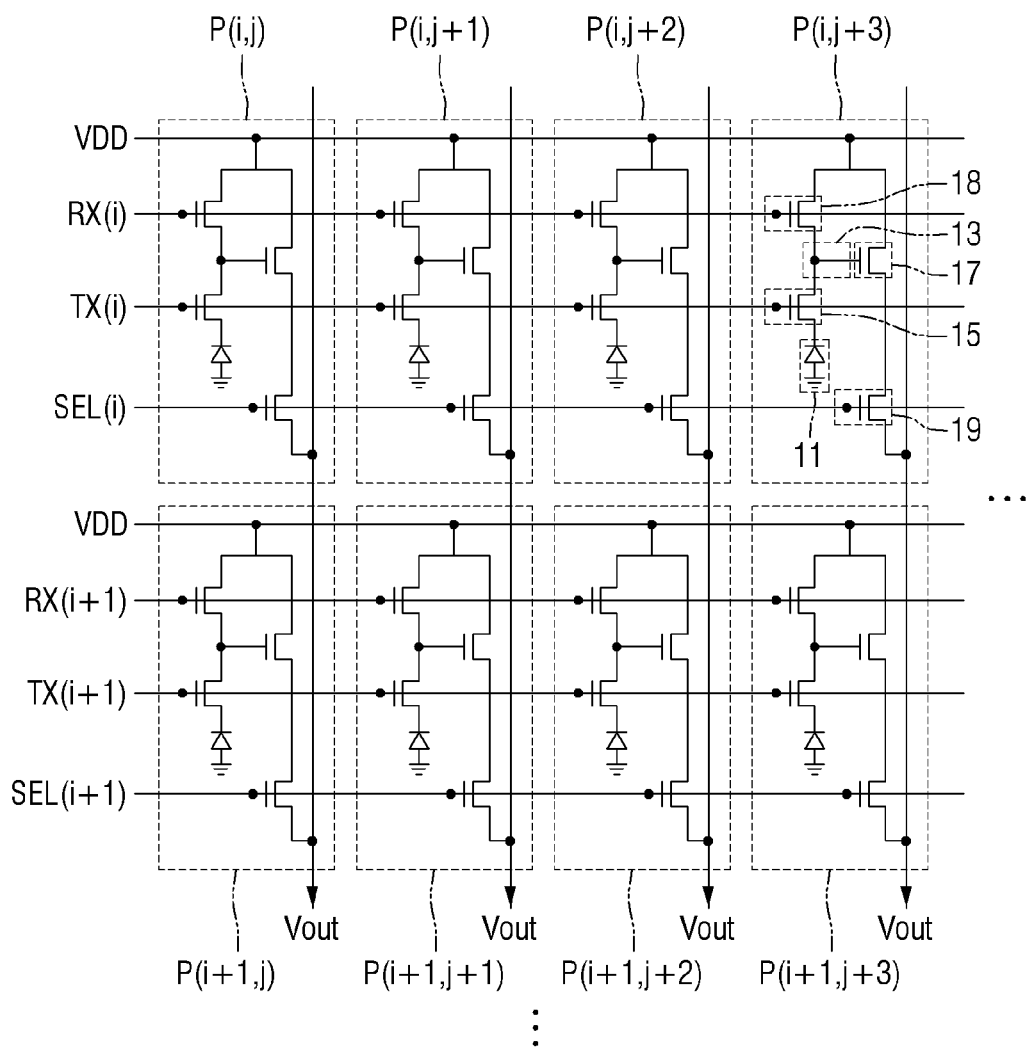
FIG. 2 is a circuit diagram of a unit pixel region of an image sensor according to some example embodiments.
Figure 3:
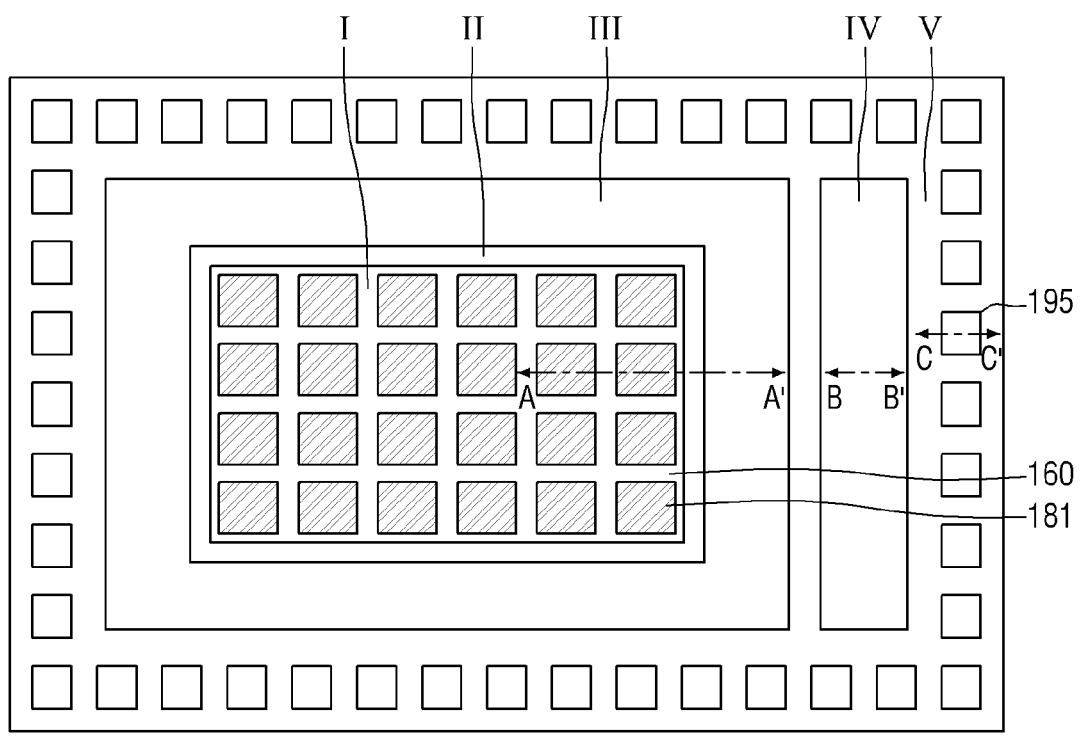
FIG. 3 is a schematic plan view of an image sensor according to some example embodiments.
Figure 3:
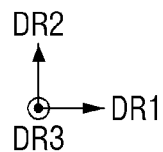
Figure 4:
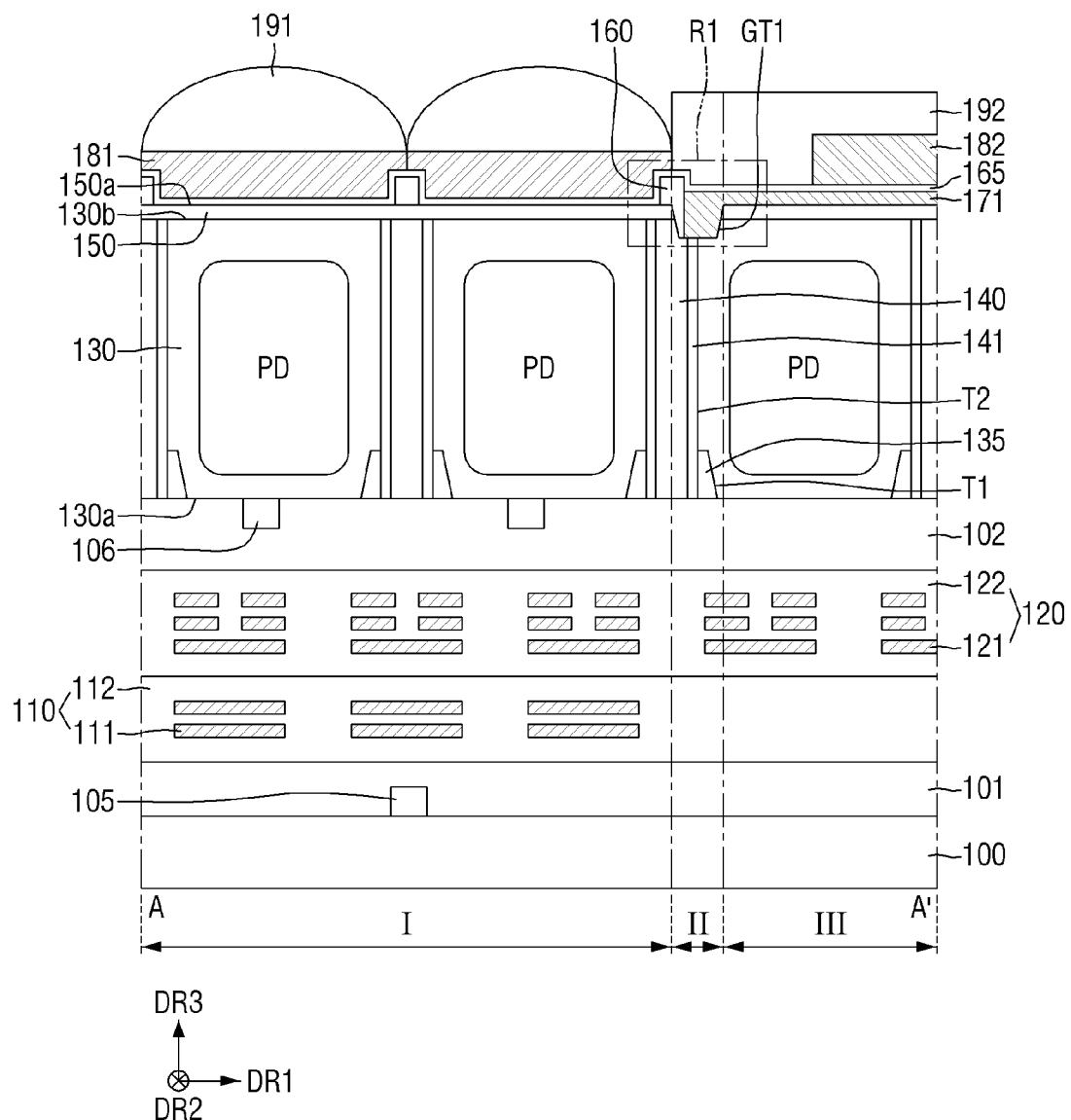
FIG. 4 is a cross-sectional view taken along a line A-A' of FIG. 3.
Figure 5A:
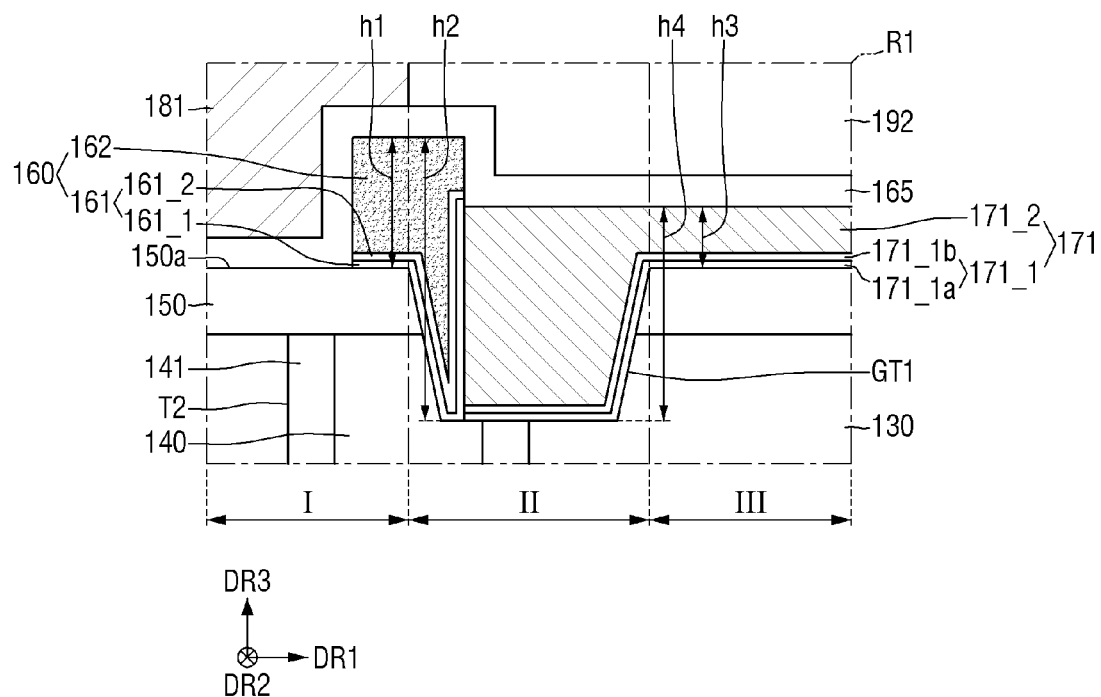
FIGS. 5a and 5b are enlarged views of a region R1 of FIG. 3.
Figure 5B:
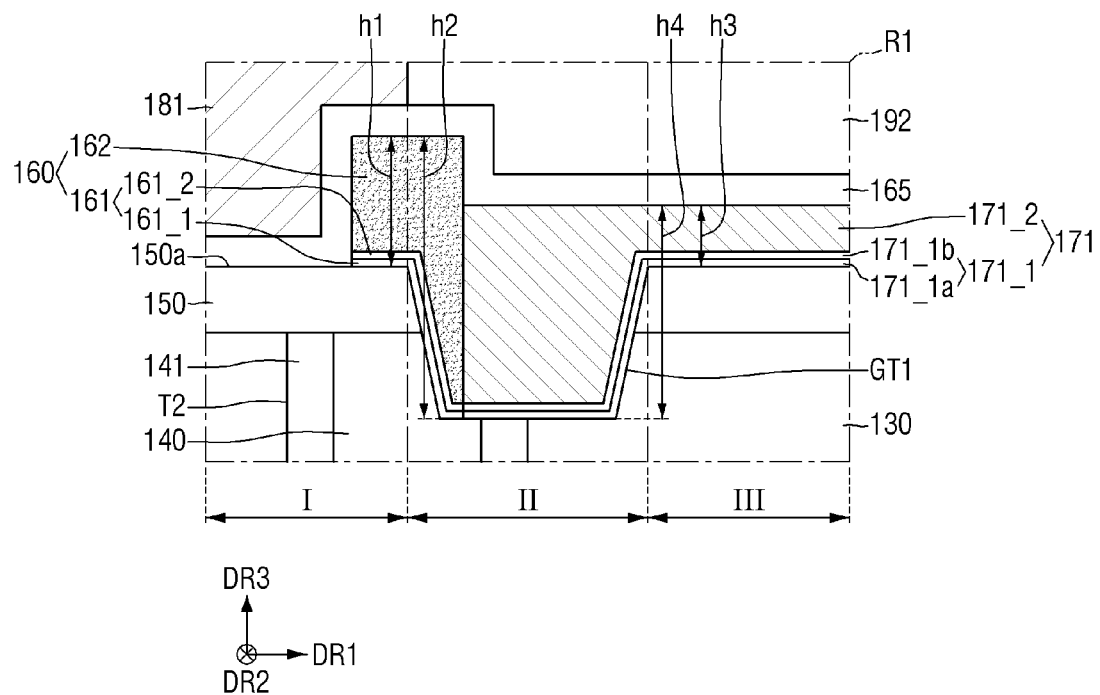
Figure 6:
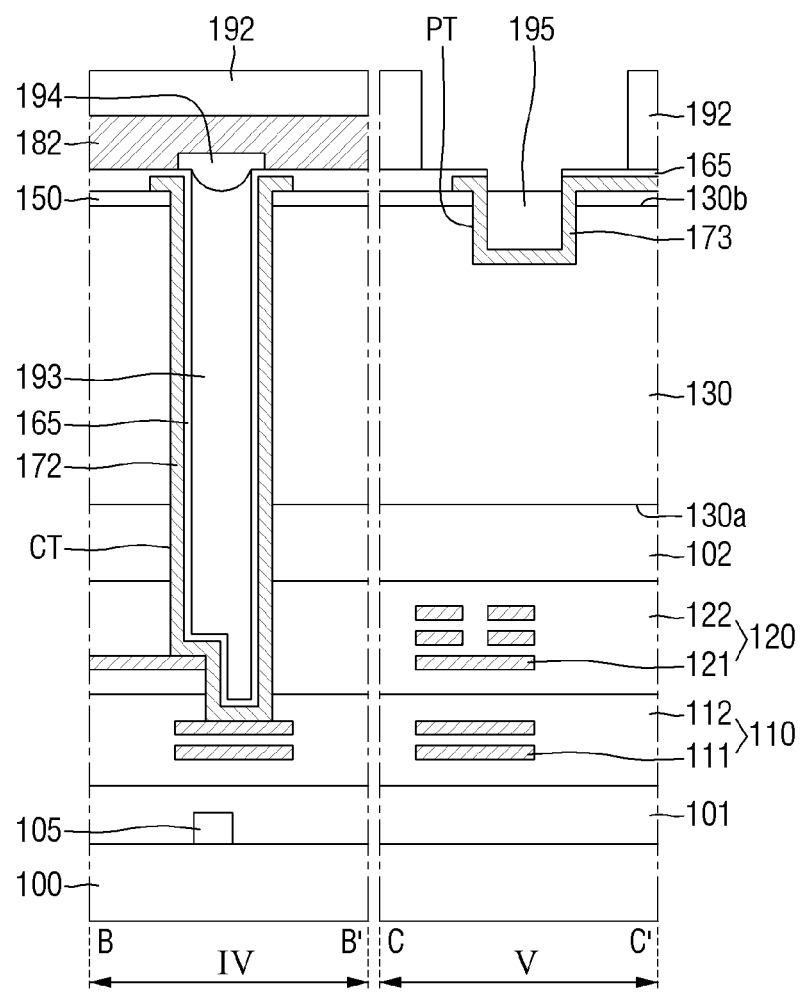
FIG. 6 is a cross-sectional view taken along lines B-B' and C-C' of FIG. 3.

FIG. 1 is a block diagram of an image sensor according to some example embodiments. FIG. 2 is a circuit diagram of a unit pixel region of an image sensor according to some example embodiments. FIG. 3 is a schematic plan view of an image sensor according to some example embodiments. FIG. 4 is a cross-sectional view taken along a line A-A' of FIG. 3. FIGS. 5a and 5b are enlarged views of a region R1 of FIG. 3. FIG. 6 is a cross-sectional view taken along lines B-B' and C-C' of FIG. 3.

Referring to FIG. 1, the image sensor according to some example embodiments includes an active pixel sensor array 10, a timing generator 20, a row decoder 30, a row driver 40, a correlated double sampler (CDS) 50, an analog-to-digital converter (ADC) 60, a latch 70 and a column decoder 80.

The active pixel sensor array 10 includes photoelectric conversion elements and a plurality of unit pixels arranged two-dimensionally. The plurality of unit pixels may perform a function of converting an optical image into an electrical output signal.

The active pixel sensor array 10 may be driven based on a plurality of drive signals, such as a row selection signal, a reset signal and a charge transmission signal, received from the row driver 40. Also, the converted electrical output signal may be provided to the correlated double sampler 50 through a vertical signal line.

The timing generator 20 may provide a timing signal and a control signal to the row decoder 30 and the column decoder 80.

The row driver 40 may provide a plurality of drive signals for driving the plurality of unit pixels to the active pixel sensor array 10 according to the results decoded in the row decoder 30. In general, when the unit pixels are placed in the form of a matrix, the drive signal may be provided for each row.

The correlated double sampler 50 may receive the output signal formed on the active pixel sensor array 10 through the vertical signal line, and hold and sample the output signal. That is, the correlated double sampler 50 may doubly sample a specific noise level and a signal level corresponding to the output signal, and output a difference level corresponding to a difference between the noise level and the signal level.

The analog-to-digital converter 60 may convert an analog signal corresponding to the difference level into a digital signal and output the digital signal.

The latch 70 latches the digital signal, and the latched signal may be sequentially output to the image signal processing unit according to the decoding result in the column decoder 80.

Referring to FIG. 2, pixels P are placed in the form of a matrix to form an active pixel sensor array 10. Each pixel P includes a photoelectric conversion element 11, a floating diffusion region 13, a charge transfer element 15, a drive element 17, a reset element 18, and a selection element 19. Functions thereof will be explained by way of an example of i-row pixels (P(i, j), P(i, j+1) P(i, j+2), P(i, j+3), . . . ).

The photoelectric conversion element 11 may absorb the incident light and accumulate the charge corresponding to an amount of light. A photo diode, a photo transistor, a photo gate, a pinned photodiode or any combination thereof may be applied as the photoelectric conversion element 11. For brevity of description, the photodiode is illustrated as an example of the photoelectric conversion element 11 in the drawings.

The photoelectric conversion element 11 may be coupled with the charge transfer element 15 that transfers the accumulated charge to the floating diffusion region 13.

Since the floating diffusion region FD 13 is a region that converts the charge into a voltage and has a parasitic capacitance, the charge may be stored therein accumulatively.

The drive element 17, which may be a source follower amplifier, amplifies a change in the electrical potential of the floating diffusion region 13 to which the charge accumulated in the photoelectric conversion element 11 is transmitted, and may output the amplified change to an output line Vout.

The reset element 18 may periodically reset the floating diffusion region 13. The reset element 18 may include a single metal-oxide-semiconductor (MOS) transistor that is driven by a bias (i.e., a reset signal) provided by a reset line RX(i).

When the reset element 18 is turned on by the bias provided by the reset line RX(i), a predetermined electrical potential provided to a drain of the reset element 18, for example, the power supply voltage VDD may be transmitted to the floating diffusion region 13.

The selection element 19 may perform a function of selecting pixels P to be read row by row. The selection element 19 may include a single MOS transistor driven by the bias (i.e., a row selection signal) provided by a row selection line SEL(i).

When the selection element 19 is turned on by the bias provided by the row selection line SEL(i), a predetermined electrical potential output from the drive element 17 is provided to the selection element 19 to be output to the output line Vout.

A transfer line TX(i) that applies a bias to the charge transfer element 15, the reset line RX(i) that applies a bias to the reset element 18, and the row selection line SEL(i) that applies a bias to the selection element 19 may extend substantially parallel to each other in a row direction.

Referring to FIG. 3, the image sensor according to some example embodiments may include first, second, third, and fourth regions I, III, IV and V and a boundary region II.

The first region I and the second region III may be a sensor array region. In a plane defined by a first direction DR1 and a second direction DR2 perpendicular to the first direction DR1, the second region III may surround the first region I.

The first region I may be an active pixel sensor region including active pixels for generating an active signal corresponding to a wavelength of light from the outside. The second region III may be an optical black sensor region for blocking light from the outside to generate an optical black signal. The boundary region II may be a region formed between the first region I and the second region III. The boundary region II may be a region in which a grid trench (e.g., GT1 of FIG. 4) is formed.

The fourth region V may be a pad region. A plurality of pads 195 placed in the fourth region V may send and receive electrical signals to and from an external device. In the plane defined by the first direction DR1 and the second direction DR2, the fourth region V may surround the second region III.

The third region IV may be a connection region. The third region IV may be electrically connected to a logic circuit region placed on a lower side 130a of a second substrate 130. The third region IV may be placed between the second region III, which is the optical black sensor region, and the fourth region V, which is the pad region.

Referring to FIGS. 3 to 6, the image sensor according to some example embodiments may include a first substrate 100, a first insulating layer 101, a second insulating layer 102, a first gate structure 105, a second gate structure 106, a first wiring structure 110, a second wiring structure 120, the second substrate 130, a photoelectric conversion element PD, a first element isolation film 135, a second element isolation film 140, a trench barrier layer 141, a passivation layer 150, a grid pattern 160, a liner layer 165, first, second, and third conductive patterns 171, 172 and 173, a first color filter 181, a second color filter 182, a microlens 191, a transparent layer 192, a second low refractive index layer 193, a photoresist 194, and a pad 195.

The first substrate 100 may be, for example, bulk silicon or SOI (silicon-on-insulator). The first substrate 100 may be a silicon substrate, or may include other materials, for example, silicon germanium, indium antimonide, lead tellurium compounds, indium arsenic, indium phosphide, gallium arsenide or gallium antimonide. In an embodiment, the first substrate 100 may have an epitaxial layer formed on a base substrate.

The first insulating layer 101 may be placed on the first substrate 100. The first insulating layer 101 may be placed to cover the first gate structure 105 that is placed on the first substrate 100. The first insulating layer 101 may include, for example, at least one of silicon oxide ($SiO_2$), silicon nitride (SiN), silicon oxynitride (SiON), a low dielectric constant material, and any combination thereof.

The first wiring structure 110 may be placed on the first insulating layer 101. The first wiring structure 110 may include a first interlayer insulating film 112, and a plurality of first wiring layers 111 placed inside the first interlayer insulating film 112.

The second wiring structure 120 may be placed on the first wiring structure 110. The second wiring structure 120 may include a second interlayer insulating film 122, and a plurality of second wiring layers 121 placed inside the second interlayer insulating film 122.

Each of the first wiring layer 111 and the second wiring layer 121 may include, for example, aluminum (Al), copper (Cu), tungsten (W), cobalt (Co), ruthenium (Ru), and the like. However, the embodiments are not limited thereto. Each of the first interlayer insulating film 112 and the second interlayer insulating film 122 may include, for example, at least one of silicon oxide ($SiO_2$), silicon nitride (SiN), silicon oxynitride (SiON), a low dielectric constant material, and any combination thereof.

The second insulating layer 102 may be placed on the second wiring structure 120. The second insulating layer 102 may be placed to cover a plurality of second gate structures 106 placed on a lower side 130a of the second substrate 130. The second gate structure 106 may be, for example, a gate of the charge transfer element, a gate of the reset element, a gate of the drive element, or the like. The second insulating layer 102 may include, for example, at least one of silicon oxide ($SiO_2$), silicon nitride (SiN), silicon oxynitride (SiON), a low dielectric constant material, and any combination thereof.

The second substrate 130 may be placed on the second insulating layer 102. The second substrate 130 may be, for example, bulk silicon or SOI (silicon-on-insulator). The second substrate 130 may be a silicon substrate, or may include other materials, for example, silicon germanium, indium antimonide, lead tellurium compounds, indium arsenic, indium phosphide, gallium arsenide or gallium antimonide. In an example embodiment, the second substrate 130 may have an epitaxial layer formed on the base substrate.

For convenience of explanation, the second substrate 130 will be defined to include the first region I in which an active pixel sensor region is formed, the second region III in which an optical black sensor region is formed, the boundary region II formed between the first region I and the second region III, the third region IV in which the connection region is formed, and the fourth region V in which the pad region is formed.

A photoelectric conversion element PD may be placed inside the second substrate 130. The photoelectric conversion element PD may be placed inside the first region I of the second substrate 130. Further, the photoelectric conversion element PD may be placed inside the second region III of the second substrate 130. However, the photoelectric conversion element PD is not placed inside each of the third region IV of the second substrate 130 and the fourth region V of the second substrate 130.

Although the photoelectric conversion element PD may be, for example, a photodiode, the embodiments are not limited thereto. A plurality of photoelectric conversion elements PD may be placed inside the second substrate 130. Each photoelectric conversion element PD may be separated by the first element isolation film 135 and the second element isolation film 140.

The first element isolation film 135 may be placed inside the first trench T1. The first trench T1 may extend from the lower side 130a of the second substrate 130 toward the inside of the second substrate 130. A lower surface of the first element isolation film 135 may be in contact with the second insulating layer 102.

The first element isolation film 135 includes, for example, at least one of silicon oxide ($SiO_2$), silicon nitride (SiN), silicon carbide (SiC), silicon oxycarbide (SiOC), silicon oxynitride (SiON) and silicon oxycarbonitride (SiOCN).

A second trench T2 may be formed on the first trench T1 between each of the plurality of photoelectric conversion elements PD. The second trench T2 may extend in a vertical direction DR3 from the lower side 130a of the second substrate 130 toward the inside of the second substrate 130. The second trench T2 may extend toward an upper side 130b of the second substrate 130. However, the embodiments are not limited thereto.

A width of the second trench T2 in the first direction DR1 may be formed to be smaller than a width of the first trench T1 in the first direction DR1.

The second element isolation film 140 may be placed inside the second trench T2. The second element isolation film 140 may include a material different from the first element isolation film 135. The second element isolation film 140 may include a material having excellent gap-fill performance, for example, polysilicon (poly-Si). However, the embodiments are not limited thereto.

The trench barrier layer 141 may be placed inside the second trench T2 along the side wall of the second trench T2. Specifically, the trench barrier layer 141 may be placed inside the second trench T2 between the side wall of the second element isolation film 140 and the second substrate 130, and between the second element isolation film 140 and the first element isolation film 135. Although FIG. 4 shows that the trench barrier layer 141 is formed in the second trench T2 conformally, the embodiments are not limited thereto.

The trench barrier layer 141 may include the same material as the passivation layer 150, for example, a high dielectric constant insulating material. However, the embodiments are not limited thereto. In some other embodiments, the trench barrier layer 141 may include a material different from the passivation layer 150.

The passivation layer 150 may be placed on the upper side 130b of the second substrate 130. The passivation layer 150 may include, for example, a high dielectric constant insulating material. Also, the passivation layer 150 may include an amorphous crystal structure. More specifically, at least a part of the high dielectric constant insulating material included in the passivation layer 150 may have an amorphous crystal structure. However, the embodiments are not limited thereto.

Although FIG. 4 shows that the passivation layer 150 is formed as a single layer, the embodiments are not limited thereto. In some other embodiments, the passivation layer 150 may further include a flattening layer and an antireflection layer. In this case, the flattening layer may include, for example, at least one of a silicon oxide film-based material, a silicon nitride film-based material, a resin or any combination thereof. The antireflection layer may include a high dielectric constant material, for example, hafnium oxide ($HfO_2$); however, the embodiments are not limited thereto.

A grid trench GT1 may be formed on the upper side 130b of the second substrate 130. The grid trench GT1 may be formed on the boundary region II of the second substrate 130. In FIG. 4, the boundary region II of the second substrate 130 may be defined as a region in which the grid trench GT1 is formed.

The grid trench GT1 may extend from an upper surface 150a of the passivation layer 150 toward the inside of the passivation layer 150. The grid trench GT1 may penetrate the penetration layer 150 in the vertical direction DR3 and extend toward the inside of the second substrate 130. However, the embodiments are not limited thereto.

At least a part of the grid trench GT1 may overlap the second element isolation film 140 in the vertical direction DR3. That is, at least a part of the second element isolation film 140 may be exposed by the grid trench GT1.

The grid pattern 160 may be placed on each of the first region I of the second substrate 130 and the boundary region II of the second substrate 130. The grid pattern 160 may be placed on the upper surface 150a of the passivation layer 150. As shown in FIG. 3, the grid pattern 160 may be formed in a grid pattern on the plane defined by the first direction DR1 and the second direction DR2.

At least a part of the grid pattern 160 may be placed inside the grid trench GT1. For example, a part of the grid pattern 160 placed on the boundary region II of the second substrate 130 may be placed inside the grid trench GT1. In the plane defined by the first direction DR1 and the second direction DR2, a part of the edges of the grid pattern 160 are placed inside the grid trench GT1, and the remaining part of the edges of the grid pattern 160 may be placed on the upper surface 150a of the passivation layer 150 adjacent to the grid trench GT1. The grid pattern 160 placed inside the grid trench GT1 may be in contact with the second element isolation film 140.

A first height h1 in the vertical direction DR3 of the grid pattern 160 placed on the upper surface 150a of the passivation layer 150 may be smaller than a second height h2 in the vertical direction DR3 of the grid pattern 160 that overlaps the grid trench GT1 in the vertical direction DR3. The upper surface of the grid pattern 160 placed on the upper surface 150a of the passivation layer 150 may be on the same plane as the upper surface of the grid pattern 160 that overlaps the grid trench GT1 in the vertical direction DR3. However, the embodiments are not limited thereto.

The grid pattern 160 may include a first barrier layer 161 and a first low refractive index layer 162.

The first barrier layer 161 may be formed of, for example, a double film. The first barrier layer 161 may include a first layer 161_1 and a second layer 161_2. The first layer 161_1 of the first barrier layer 161 may provide a bottom surface of the grid pattern 160. The first layer 161_1 of the first barrier layer 161 may include a metal. The first layer 161_1 of the first barrier layer 161 may include, for example, titanium (Ti); however, the embodiments are not limited thereto.

The second layer 161_2 of the first barrier layer 161 may be placed on the first layer 161_1 of the first barrier layer 161. The second layer 161_2 of the first barrier layer 161 may include, for example, titanium nitride (TiN). However, the embodiments are not limited thereto.

The first barrier layer 161 may be placed along the side wall of the first conductive pattern 171 on the boundary region II of the second substrate 130. That is, the first layer 161_1 of the first barrier layer 161 may be placed along the side wall of the first conductive pattern 171 on the boundary region II of the second substrate 130.

Further, the first barrier layer 161 may be placed along the upper surface 150a of the passivation layer 150, a side wall of the grid trench GT1, and the bottom surface of the grid trench GT1. That is, the first layer 161_1 of the first barrier layer 161 may be placed along the upper surface 150a of the passivation layer 150 on the first region I of the second substrate 130, and may be placed along a side wall of the grid trench GT1 and the bottom surface of the grid trench GT1 on the boundary region II of the second substrate 130.

Each of the first layer 161_1 of the first barrier layer 161 and the second layer 161_2 of the first barrier layer 161 may be formed conformally. However, the embodiments are not limited thereto.

The first low refractive index layer 162 may be placed on the second layer 161_2 of the first barrier layer 161. The upper surface of the first low refractive index layer 162 may be formed to be higher than the upper surface of the first conductive pattern 171. The first low refractive index layer 162 may include, for example, at least one of oxides, nitrides and oxynitrides. However, the embodiments are not limited thereto.

The first conductive pattern 171 may be placed on each of the boundary region II of the second substrate 130 and the second region III of the second substrate 130. The first conductive pattern 171 may be placed on the upper surface 150a of the passivation layer 150.

At least a part of the first conductive pattern 171 may be placed inside the grid trench GT1. For example, a part of the first conductive pattern 171 placed on the boundary region II of the second substrate 130 may be placed inside the grid trench GT1.

The first conductive pattern 171 placed inside the grid trench GT1 may be in contact with the second element isolation film 140. The first conductive pattern 171 placed inside the grid trench GT1 may be in contact with the second substrate 130. The first conductive pattern 171 placed inside the grid trench GT1 may be in contact with the side wall of the grid pattern 160.

As shown in FIG. 5a, the first barrier layer 161 may be placed between the first low refractive index layer 162 and the first conductive pattern 171. However, the embodiments are not limited thereto. In some other embodiments, the first barrier layer 161 may not be placed between the first low refractive index layer 162 and the first conductive pattern 171, as shown in FIG. 5b. That is, the first low refractive index layer 162 may be in direct contact with the first conductive pattern 171.

A third height h3 in the vertical direction DR3 of the first conductive pattern 171 placed on the upper surface 150a of the passivation layer 150 may be smaller than a fourth height h4 in the vertical direction DR3 of the first conductive pattern 171 that overlaps the grid trench GT1 in the vertical direction DR3. The upper surface of the first conductive pattern 171 placed on the upper surface 150a of the passivation layer 150 may be on the same plane as the upper surface of the first conductive pattern 171 that overlaps the grid trench GT1 in the vertical direction DR3. However, the embodiments are not limited thereto.

The first conductive pattern 171 may include a second barrier layer 171_1 and a metal layer 171_2.

The second barrier layer 171_1 may be formed, for example, as a double film. The second barrier layer 171_1 may include a first layer 171_1a and a second layer 171_1b. The first layer 171_1a of the second barrier layer 171_1 may provide a bottom surface of the first conductive pattern 171. The first layer 171_1a of the second barrier layer 171_1 may include metal. The first layer 171_1a of the second barrier layer 171_1 may include, for example, titanium (Ti); however, the embodiments are not limited thereto.

The second layer 171_1b of the second barrier layer 171_1 may be placed on the first layer 171_1a of the second barrier layer 171_1. The second layer 171_1b of the second barrier layer 171_1 may include, for example, titanium nitride (TiN). However, the embodiments are not limited thereto.

The second barrier layer 171_1 may be placed along the upper surface 150a of the passivation layer 150, a side wall of the grid trench GT1 and the bottom surface of the grid trench GT1. That is, the first layer 171_1a of the second barrier layer 171_1 may be placed along the upper surface 150a of the passivation layer 150 on the second region III of the second substrate 130, and may be placed along a side wall of the grid trench GT1 and the bottom surface of the grid trench GT1 on the boundary region II of the second substrate 130.

Each of the first layer 171_1a of the second barrier layer 171_1 and the second layer 171_1b of the second barrier layer 171_1 may be formed conformally. However, the embodiments are not limited thereto.

The metal layer 171_2 may be placed on the second layer 171_1b of the second barrier layer 171_1. The metal layer 171_2 may include metal. The metal layer 171_2 may include, for example, tungsten (W). However, the embodiments are not limited thereto.

A connection trench CT may be formed in the third region IV of the second substrate 130, which is a connection region. The connection trench CT may penetrate the penetration layer 150, the second substrate 130, the second insulating layer 102 and the second wiring structure 120 in the vertical direction DR3. The connection trench CT may extend toward the inside of the first wiring structure 110.

The connection trench CT may expose the first wiring layer 111 and the second wiring layer 121. The connection trench CT may have a step between a portion which exposes the first wiring layer 111 and a portion which exposes the second wiring layer 121.

The second conductive pattern 172 may be placed along the side walls and a bottom surface of the connection trench CT. The second conductive pattern 172 may be formed, for example, conformally. At least a part of the second conductive pattern 172 may extend onto the upper surface 150a of the passivation layer 150.

A second conductive pattern 172 may include metal. For example, the second conductive pattern 172 may include at least one of titanium (Ti) and tungsten (W); however, the embodiments are not limited thereto.

A pad trench PT may be formed in the fourth region V of the second substrate 130, which is a pad region. The pad trench PT may penetrate the passivation layer 150 in the vertical direction DR3 and extend into the inside of the second substrate 130.

A third conductive pattern 173 may be placed along the side walls and the bottom surface of the pad trench PT. The third conductive pattern 173 may be formed, for example, conformally. At least a part of the third conductive pattern 173 may extend onto the upper surface 150a of the passivation layer 150.

The third conductive pattern 173 may include metal. For example, the third conductive pattern 173 may include at least one of titanium (Ti) and tungsten (W); however, the embodiments are not limited thereto.

The pad 195 may fill the inside of the pad trench PT on the third conductive pattern 173. The pad 195 may include a conductive material.

The liner layer 165 may be placed on the passivation layer 150. The liner layer 165 may be placed on the passivation layer 150 to cover the upper surface 150a of the passivation layer 150, the grid pattern 160, the first conductive pattern 171, and the second conductive pattern 172. Further, the liner layer 165 may be placed to cover the third conductive pattern 173 extending onto the passivation layer 150. The liner layer 165 may be formed conformally on each of the first region I, the boundary region II and the second region III of the second substrate 130. However, the embodiments are not limited thereto.

The liner layer 165 may be placed on the second conductive pattern 172 inside the connection trench CT. The liner layer 165 may be formed conformally inside the connection trench CT. However, the embodiments are not limited thereto.

The liner layer 165 may include, for example, aluminum oxide ($Al_2O_3$); however, the embodiments are not limited thereto.

The first color filter 181 may be placed on the first region I of the second substrate 130, which is an active pixel sensor region. The first color filter 151 is not placed on the second region III of the second substrate 130, which is an optical black sensor region.

The first color filter 181 may be placed between the grid patterns 160 on the liner layer 165. At least a part of the first color filter 181 may be placed on the upper surface of the grid pattern 160; however, the embodiments are not limited thereto.

The first color filter 181 may include a red, green, or blue color filter depending on a unit pixel. Also, the first color filter 181 may also include a yellow filter, a magenta filter and a cyan filter, and may further include a white filter.

The microlens 191 may be placed on the first region I of the second substrate 130, which is an active pixel sensor region. The microlens 191 is not placed on the second region III of the second substrate 130, which is the optical black sensor region.

The microlens 191 may be placed on the first color filter 181. Microlenses 191 may be arranged to correspond to unit pixels, respectively. For example, one microlens 191 may be placed on one first color filter 181. However, the embodiments are not limited thereto. The microlenses 191 may be arranged two-dimensionally (e.g., in the form of a matrix) in a plane defined by the first direction DR1 and the second direction DR2.

The microlens 191 has a convex shape and may have a predetermined radius of curvature. Accordingly, the microlens 191 may concentrate the incident light onto the photoelectric conversion element PD. The microlens 191 may include, for example, an organic material such as a photosensitive resin or an inorganic material; however, the embodiments of the present disclosure is not limited thereto.

The second low refractive index layer 193 may be placed on the liner layer 165 inside the connection trench CT. The second low refractive index layer 193 may fill the inside of the connection trench CT. The second low refractive index layer 193 may include, for example, at least one of oxides, nitrides and oxynitrides. However, the embodiments of the present disclosure is not limited thereto.

The photoresist 194 may be placed on the second low refractive index layer 193. A part of the photoresist 194 may be placed to protrude from the upper surface of the liner layer 165. However, the embodiments are not limited thereto. That is, in some other embodiments, the photoresist 194 may be omitted.

The second color filter 182 may be placed on the second region III of the second substrate 130 which is an optical black sensor region, and the third region IV of the second substrate 130 which is a connection region. The second color filter 182 may be placed on the liner layer 165. The second color filter 182 is not placed on the fourth region V of the second substrate 130, which is a pad region.

The second color filter 182 may be in contact with, for example, the upper surface of the liner layer 165. For example, the upper surface of the second color filter 182 may be formed to be higher than the upper surface of the first color filter 181. However, the embodiments are not limited thereto. The second color filter 182 may include, for example, a blue color filter.

The transparent layer 192 may be placed on the liner layer 165 and the second color filter 182. The transparent layer 192 may be placed, for example, to completely cover the second color filter 182. However, the embodiments are not limited thereto. The transparent layer 192 is not placed on the pad 195. The transparent layer 192 may include, for example, a material through which light transmits.

In the image sensor according to some example embodiments, by forming a grid trench GT1 between the active pixel sensor region and the optical black sensor region, and by forming at least a part of the grid pattern 160 inside the grid trench GT1, the step between the grid pattern 160 and the first conductive pattern 171 may be reduced. Therefore, the image sensor according to some example embodiments may reduce a stain defect caused by the step between the active pixel sensor region and the optical black sensor region.

Hereinafter, the image sensor according to some other example embodiments will be explained referring to FIGS. 7a and 7b. Differences from the image sensor shown in FIGS. 3 to 6 will be mainly explained.

Figure 7A:
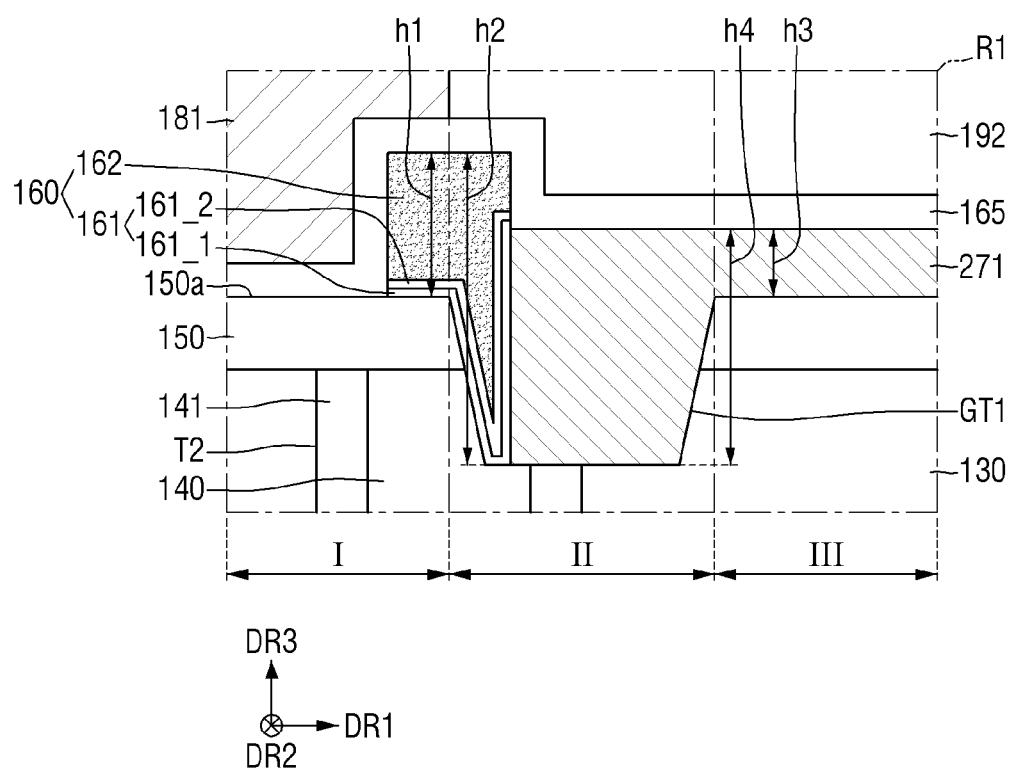
FIGS. 7a and 7b are enlarged views for showing an image sensor according to some other example embodiments.
Figure 7B:
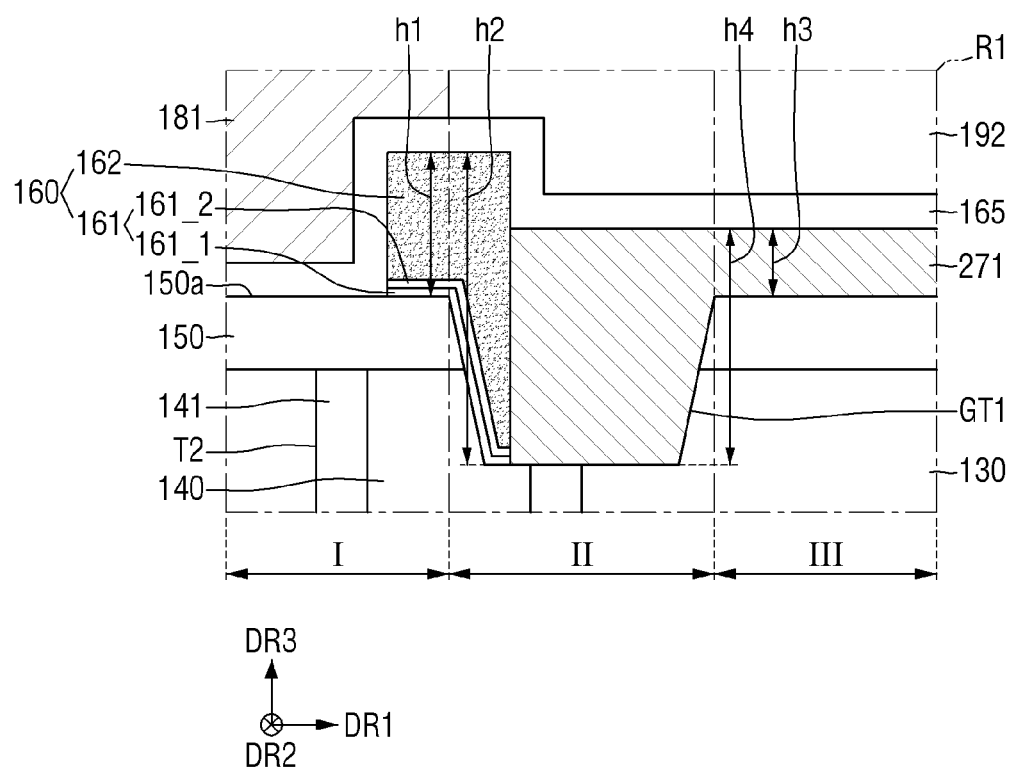

FIGS. 7a and 7b are enlarged views for explaining an image sensor according to some other embodiments.

Referring to FIGS. 7a and 7b, in the image sensor according to some other example embodiments, a first conductive pattern 271 may be formed of a single film. The first conductive pattern 271 may be in contact with each of side walls of the second element isolation film 140, the second substrate 130 and the passivation layer 150 inside the grid trench GT1. Also, the first conductive pattern 271 may be in contact with the upper surface 150a of the passivation layer 150 placed on the second region III of the second substrate 130.

As shown in FIG. 7a, the first barrier layer 161 may be placed between the first low refractive index layer 162 and the first conductive pattern 271. However, the embodiments are not limited thereto. In some other embodiments, the first barrier layer 161 may not be placed between the first low refractive index layer 162 and the first conductive pattern 271, as shown in FIG. 7b. That is, the first low refractive index layer 162 may be in direct contact with the first conductive pattern 271.

Hereinafter, an image sensor according to some other example embodiments will be explained referring to FIGS. 8 and 9. Differences from the image sensor shown in FIGS. 3 to 6 will be mainly explained.

Figure 8:
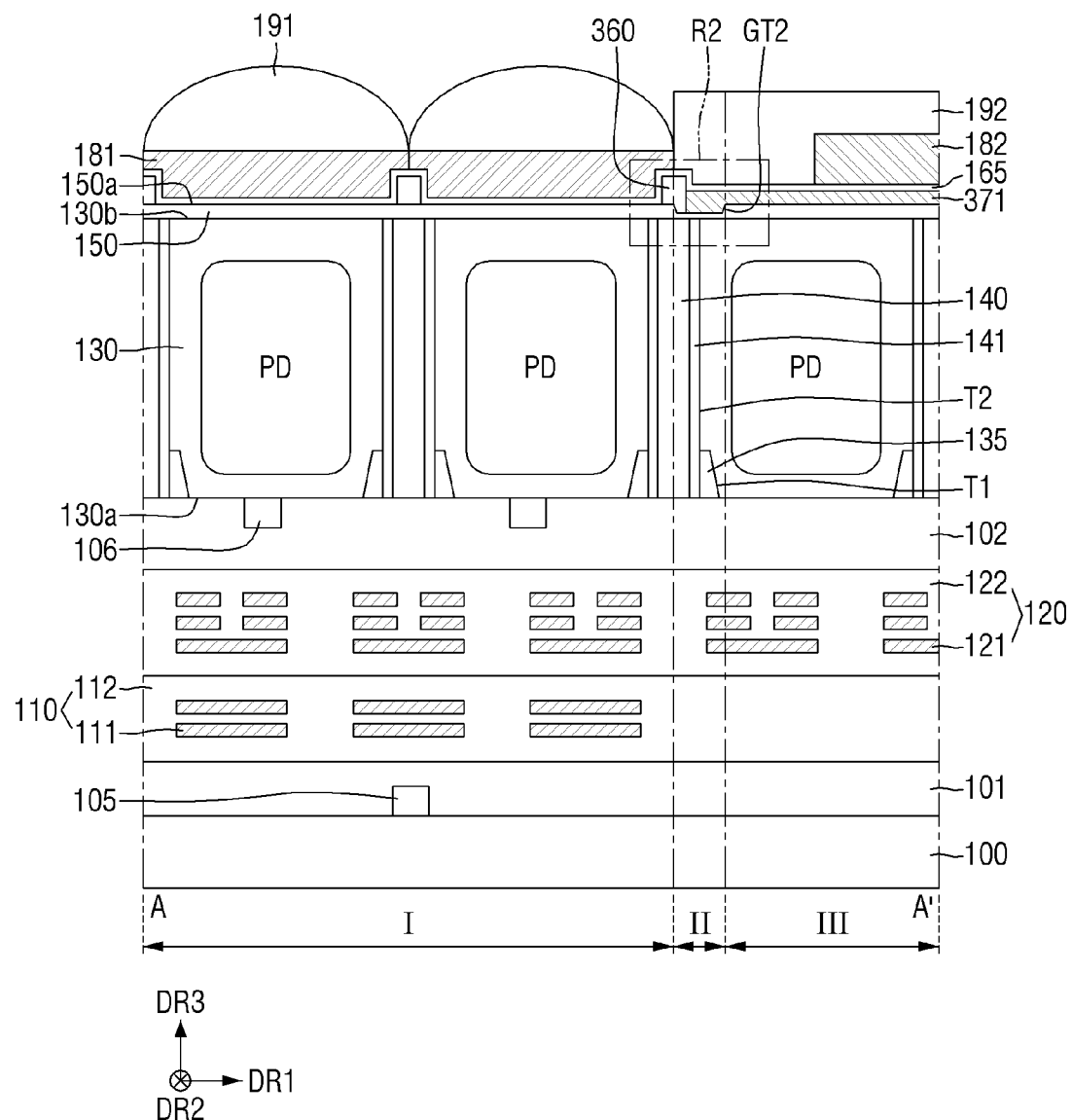
FIG. 8 is a cross-sectional view for explaining an image sensor according to some other example embodiments.

FIG. 8 is a cross-sectional view for explaining an image sensor according to some other example embodiments. FIG. 9 is an enlarged view of a region R2 of FIG. 8.

Figure 9:
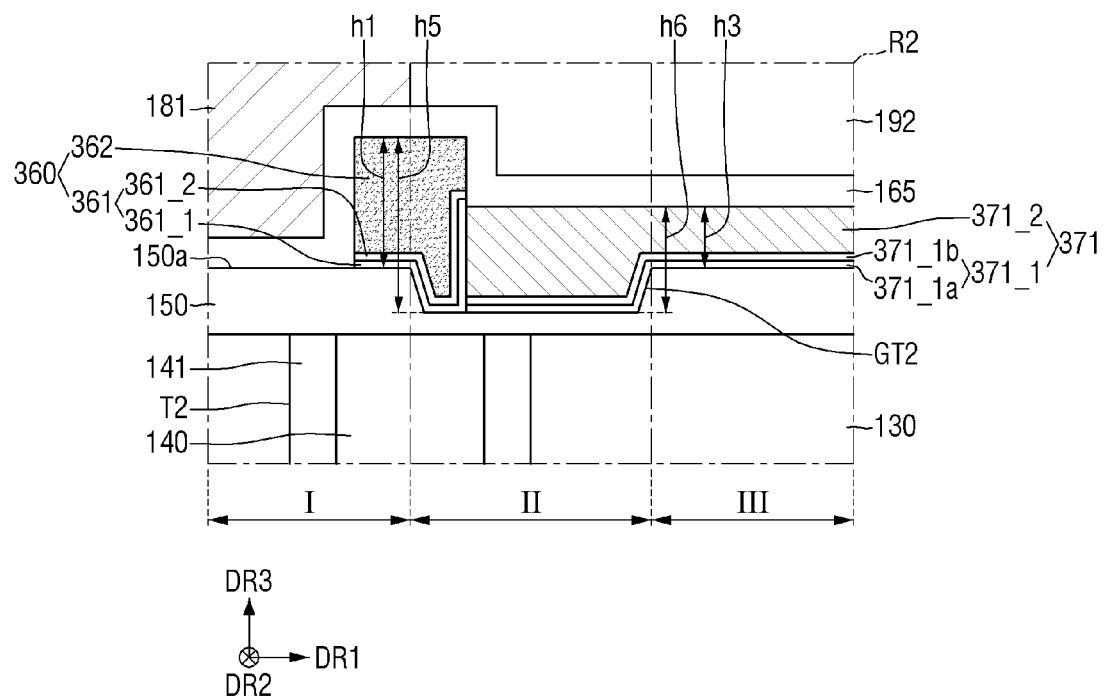
FIG. 9 is an enlarged view of a region R2 of FIG. 8.

Referring to FIGS. 8 and 9, in the image sensor according to some other embodiment of the present disclosure, a grid trench GT2 may be formed inside the passivation layer 150. That is, a lower surface of the grid trench GT2 may be formed inside the passivation layer 150.

At least a part of the grid pattern 360 may be placed inside the grid trench GT2. The grid pattern 360 may include a first barrier layer 361, and a first low refractive index layer 362 placed on the first barrier layer 361. The first barrier layer 361 may include a first layer 361_1, and a second layer 361_2 placed on the first layer 361_1.

A first height h1 in the vertical direction DR3 of the grid pattern 360 placed on the upper surface 150a of the passivation layer 150 may be smaller than a fifth height h5 in the vertical direction DR3 of the grid pattern 360 that overlaps the grid trench GT2 in the vertical direction DR3. The upper surface of the grid pattern 360 placed on the upper surface 150a of the passivation layer 150 may be on the same plane as the upper surface of the grid pattern 360 that overlaps the grid trench GT2 in the vertical direction DR3. However, the embodiments are not limited thereto.

At least a part of the first conductive pattern 371 may be placed inside the grid trench GT2. The first conductive pattern 371 may include a second barrier layer 371_1, and a metal layer 371_2 placed on the second barrier layer 371_1. The second barrier layer 371_1 may include a first layer 371_1a, and a second layer 371_1b placed on the first layer 371_1a.

A third height h3 in the vertical direction DR3 of the first conductive pattern 371 placed on the upper surface 150a of the passivation layer 150 may be smaller than a sixth height h6 in the vertical direction DR3 of the first conductive pattern 371 that overlaps the grid trench GT2 in the vertical direction DR3. The upper surface of the first conductive pattern 371 placed on the upper surface 150a of the passivation layer 150 may be on the same plane as the upper surface of the first conductive pattern 371 that overlaps the grid trench GT2 in the vertical direction DR3. However, the embodiments are not limited thereto.

Hereinafter, an image sensor according to some other example embodiments will be explained referring to FIGS. 10 and 11. Differences from the image sensor shown in FIGS. 3 to 6 will be mainly explained.

Figure 10:
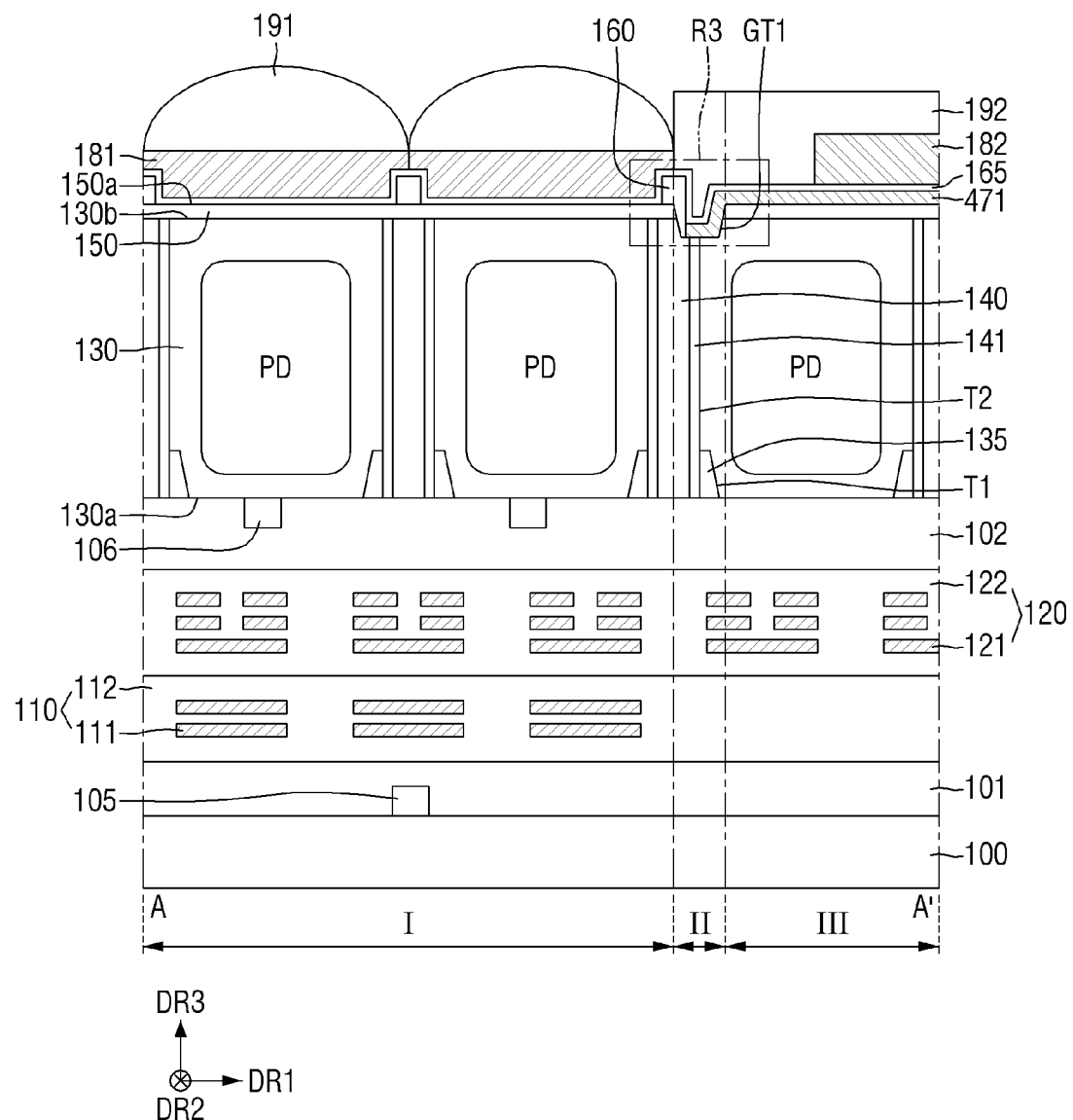
FIG. 10 is a cross-sectional view for explaining an image sensor according to some other example embodiments.

FIG. 10 is a cross-sectional view for explaining an image sensor according to some other example embodiments. FIG. 11 is an enlarged view of a region R3 of FIG. 10.

Figure 11:
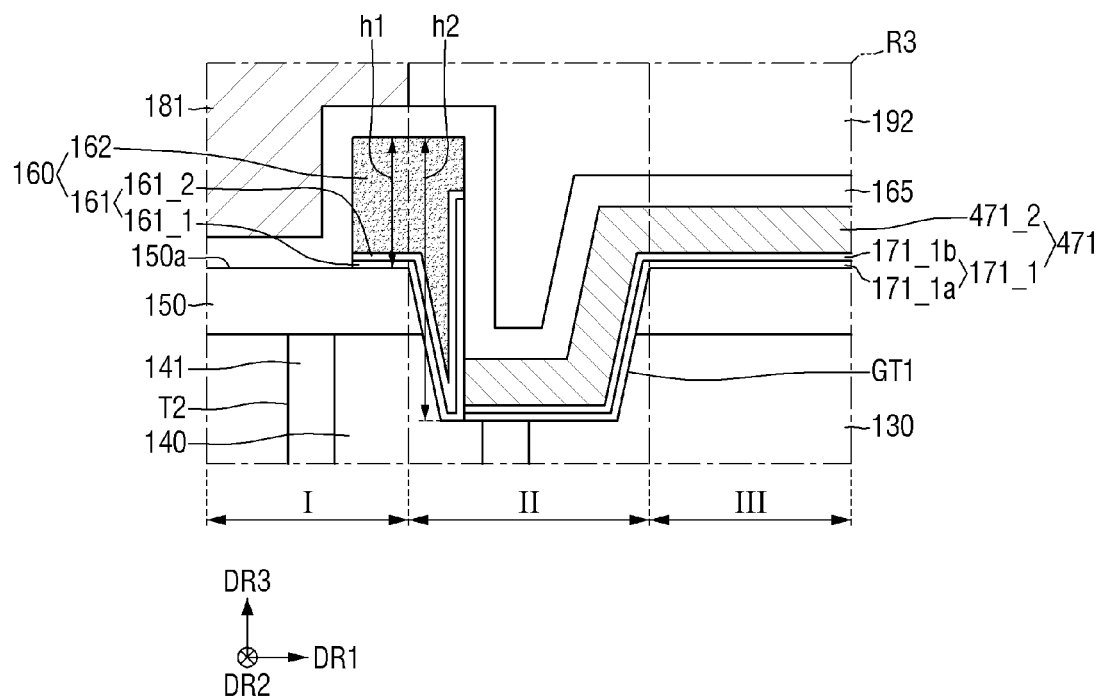
FIG. 11 is an enlarged view of a region R3 of FIG. 10.

Referring to FIGS. 10 and 11, in the image sensor according to some other embodiment of the present disclosure, a first conductive pattern 471 may be placed along the side wall and the bottom surface of the grid trench GT1 conformally. That is, the metal layer 471_2 placed on the second barrier layer 171_1 may be placed on the side wall and the bottom surface of the grid trench GT1 conformally.

In the grid trench GT1, the liner layer 165 and the transparent layer 192 may be placed in the remaining portions other than the portion in which the grid pattern 160 and the first conductive pattern 471 are placed inside the grid trench GT1.

Hereinafter, an image sensor according to some other example embodiments will be explained referring to FIGS. 12 and 13. Differences from the image sensor shown in FIGS. 3 to 6 will be mainly explained.

Figure 12:
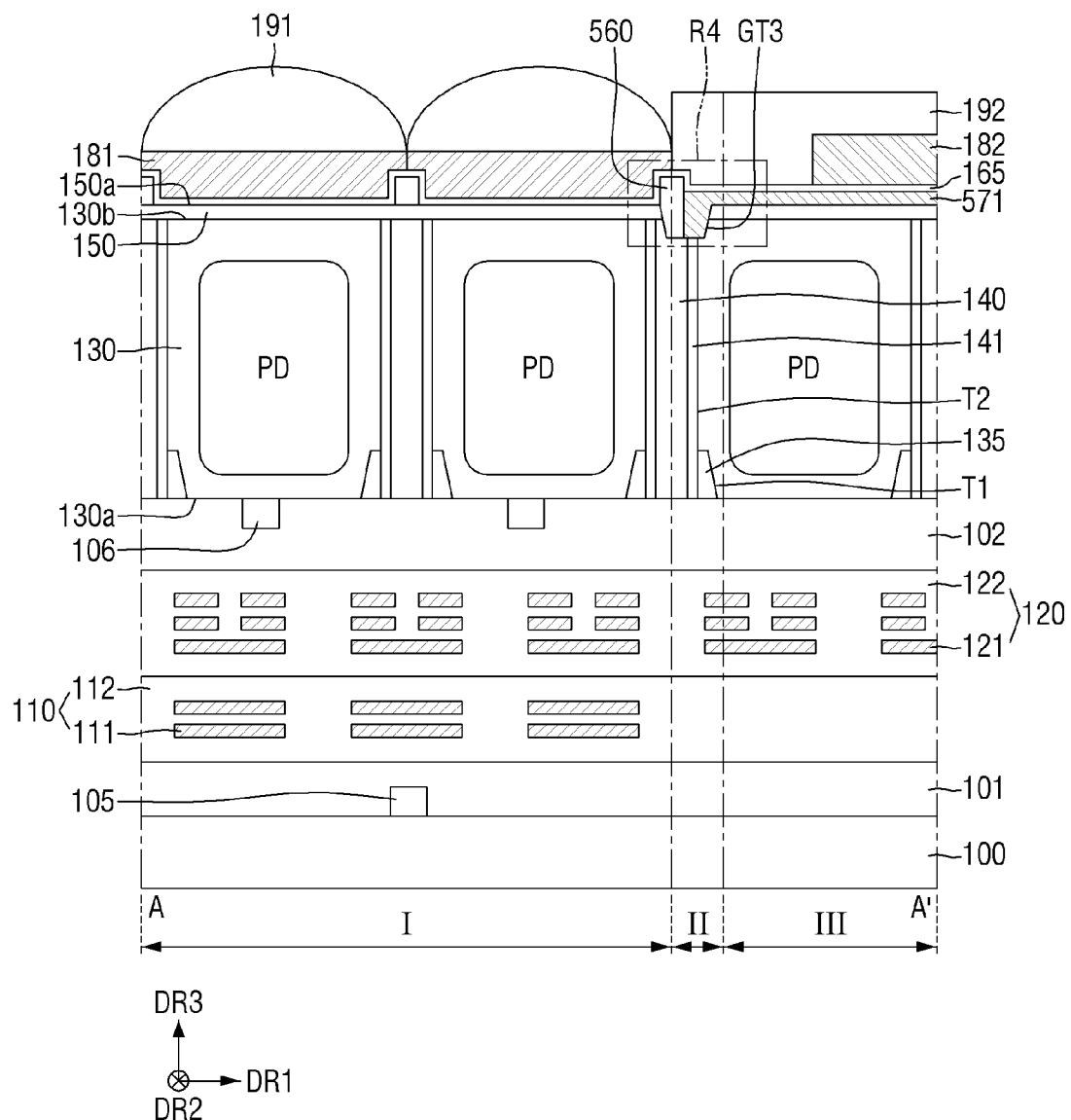
FIG. 12 is a cross-sectional view for explaining an image sensor according to some other example embodiments.

FIG. 12 is a cross-sectional view for explaining an image sensor according to some other example embodiments. FIG. 13 is an enlarged view of a region R4 of FIG. 11.

Figure 13:
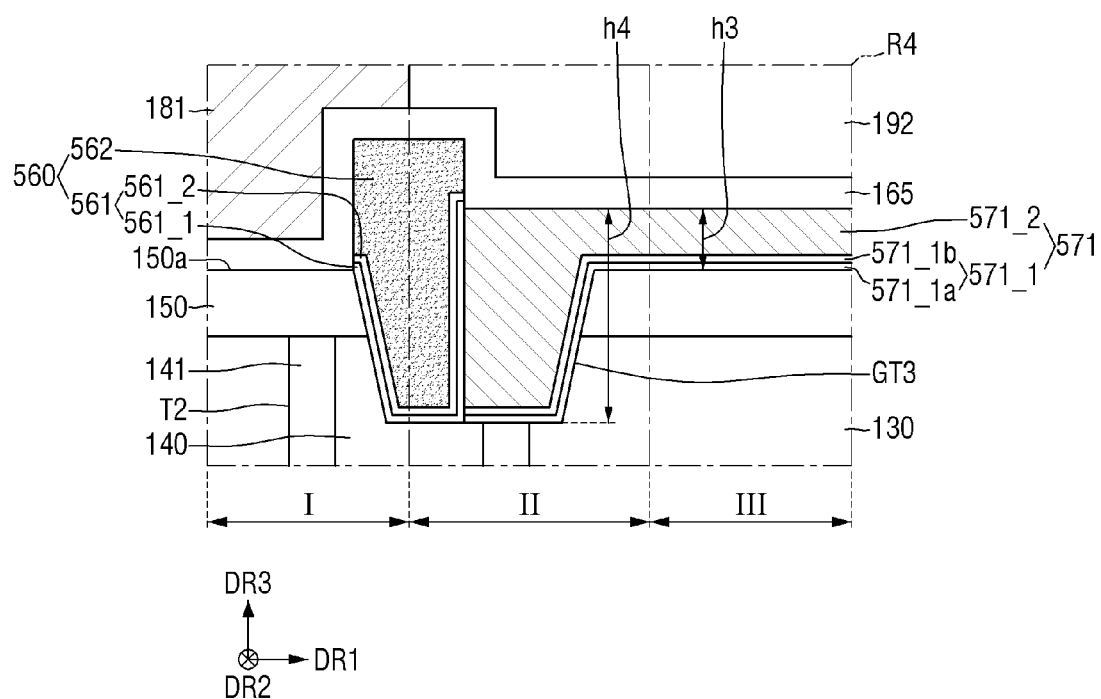
FIG. 13 is an enlarged view of a region R4 of FIG. 11.

Referring to FIGS. 12 and 13, in the image sensor according to some other embodiment of the present disclosure, in a plane defined by the first direction DR1 and the second direction DR2, a portion formed in an annular shape at the outermost edge of a grid pattern 560 may completely overlap the grid trench GT3 in the vertical direction DR3.

While FIG. 13 shows that the grid trench GT3 is formed over the first region I of the second substrate 130 and the boundary region II of the second substrate 130, the embodiments are not limited thereto. In some other embodiments, the grid trench GT3 may be formed only in the boundary region II of the second substrate 130.

The grid pattern 560 may include a first barrier layer 561, and a first low refractive index layer 562 placed on the first barrier layer 561. The first barrier layer 561 may include a first layer 561_1, and a second layer 561_2 placed on the first layer 561_1.

The first conductive pattern 571 may include a second barrier layer 571_1, and a metal layer 571_2 placed on the second barrier layer 571_1. The second barrier layer 571_1 may include a first layer 571_1a, and a second layer 571_1b placed on the first layer 571_1a.

Hereinafter, an image sensor according to some other example embodiments will be explained referring to FIGS. 14, 15a and 15b. Differences from the image sensor shown in FIGS. 3 to 6 will be mainly explained.

Figure 14:
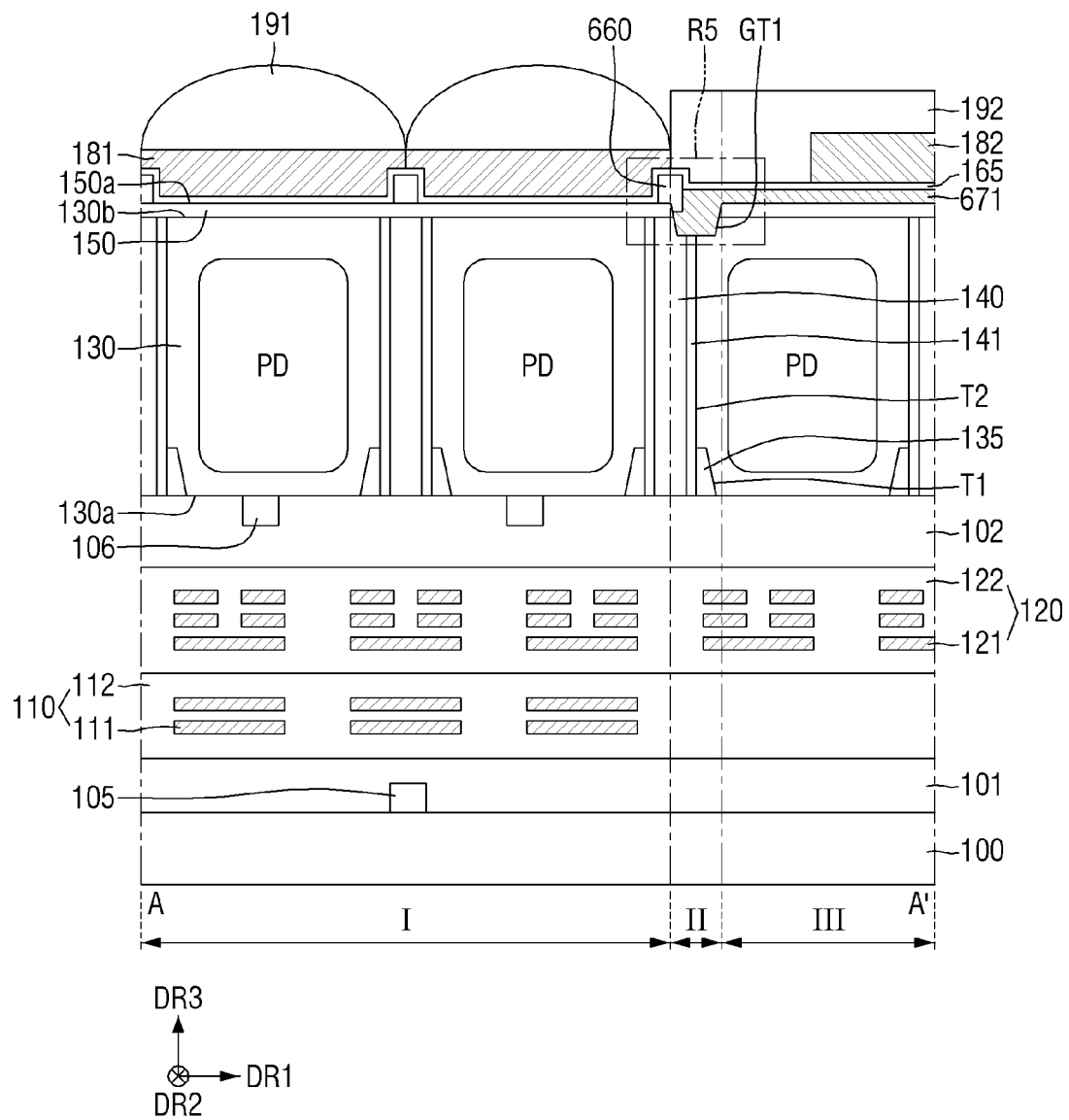
FIG. 14 is a cross-sectional view for explaining an image sensor according to some other example embodiments.

FIG. 14 is a cross-sectional view for explaining an image sensor according to some other example embodiments. FIGS. 15a and 15b are enlarged views of a region R5 of FIG. 14.

Figure 15A:
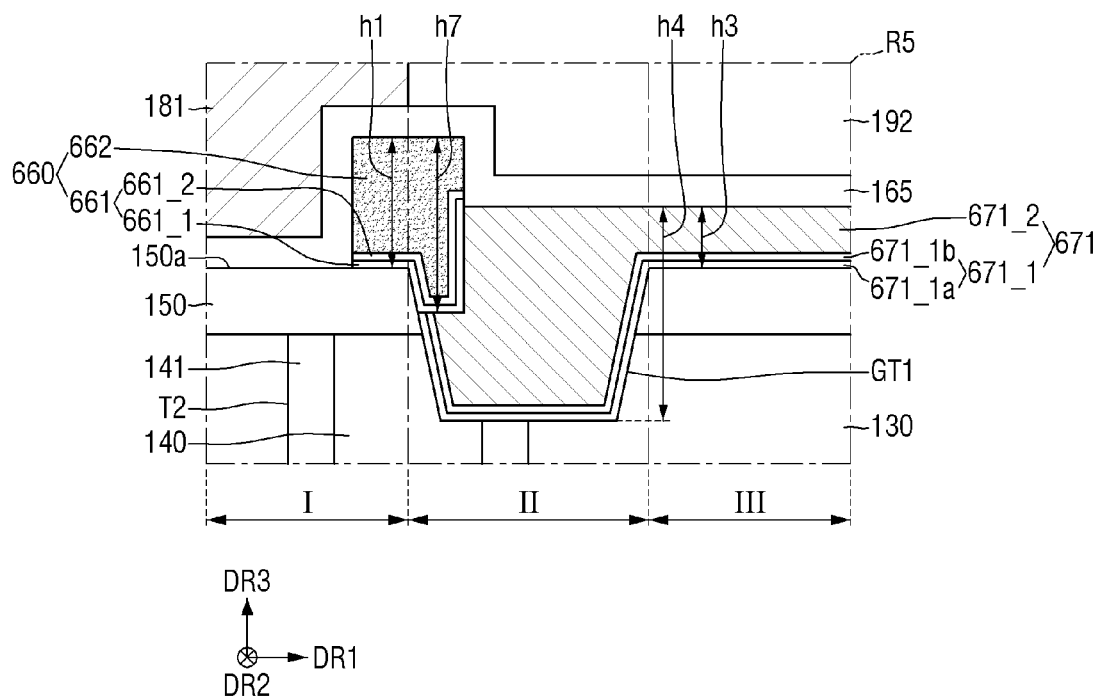
FIGS. 15a and 15b are enlarged views of a region R5 of FIG. 14.
Figure 15B:
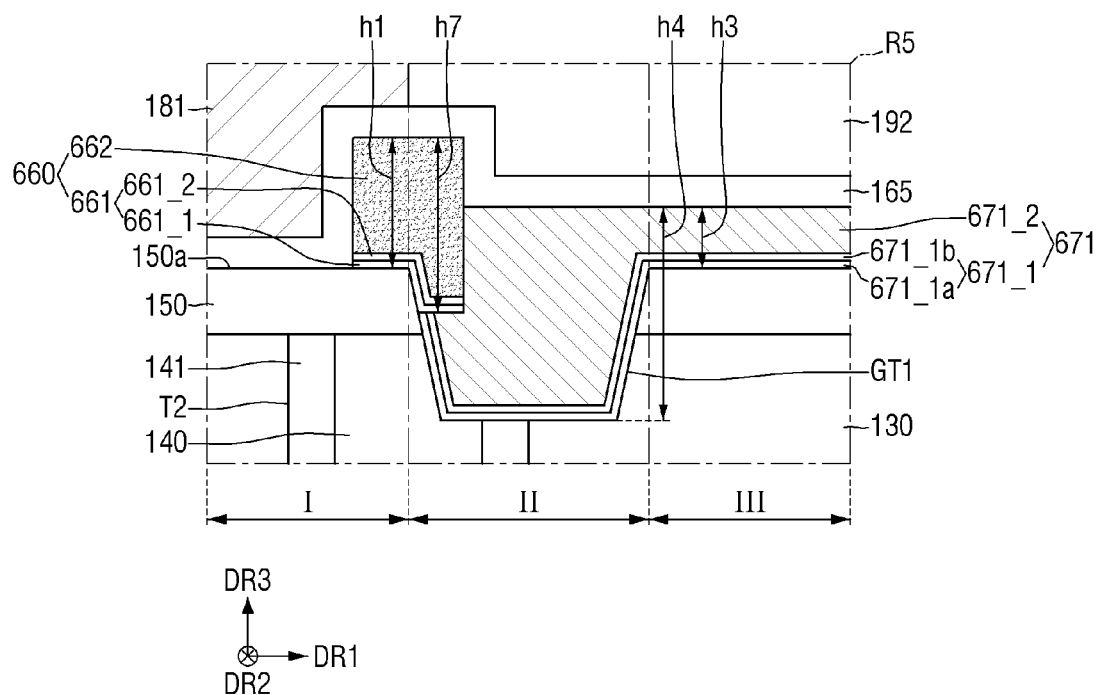

Referring to FIGS. 14, 15a and 15b, in an image sensor according to some other embodiment of the present disclosure, at least a part of the first conductive pattern 671 may be placed below the grid pattern 660, inside the grid trench GT1. A part of the grid pattern 660 placed inside the grid trench GT1 does not extend toward the bottom surface of the grid trench GT1.

The grid pattern 660 may include a first barrier layer 661, and a first low refractive index layer 662 placed on the first barrier layer 661. The first barrier layer 661 may include a first layer 661_1, and a second layer 661_2 placed on the first layer 661_1.

A first height h1 in the vertical direction DR3 of the grid pattern 660 placed on the upper surface 150a of the passivation layer 150 may be smaller than a seventh height h7 in the vertical direction DR3 of the grid pattern 660 that overlaps the grid trench GT1 in the vertical direction DR3. The upper surface of the grid pattern 660 placed on the upper surface 150a of the passivation layer 150 may be on the same plane of the upper surface of the grid pattern 660 that overlaps the grid trench GT1 in the vertical direction DR3. However, the embodiments are not limited thereto.

The first conductive pattern 671 may include a second barrier layer 671_1, and a metal layer 671_2 placed on the second barrier layer 671_1. The second barrier layer 671_1 may include a first layer 671_1a, and a second layer 671_1b placed on the first layer 671_1a.

As shown in FIG. 15a, the first barrier layer 661 may be placed between the first low refractive index layer 662 and the first conductive pattern 671. However, the embodiments are not limited thereto. In some other embodiments, as shown in FIG. 15b, the first barrier layer 661 may not be placed between the side wall of the first low refractive index layer 662 and the first conductive pattern 671. That is, the side wall of the first low refractive index layer 662 may be in direct contact with the first conductive pattern 671.

Hereinafter, an image sensor according to some other embodiment of the present disclosure will be explained referring to FIGS. 16 and 17. Differences from the image sensor shown in FIGS. 3 to 6 will be mainly explained.

Figure 16:
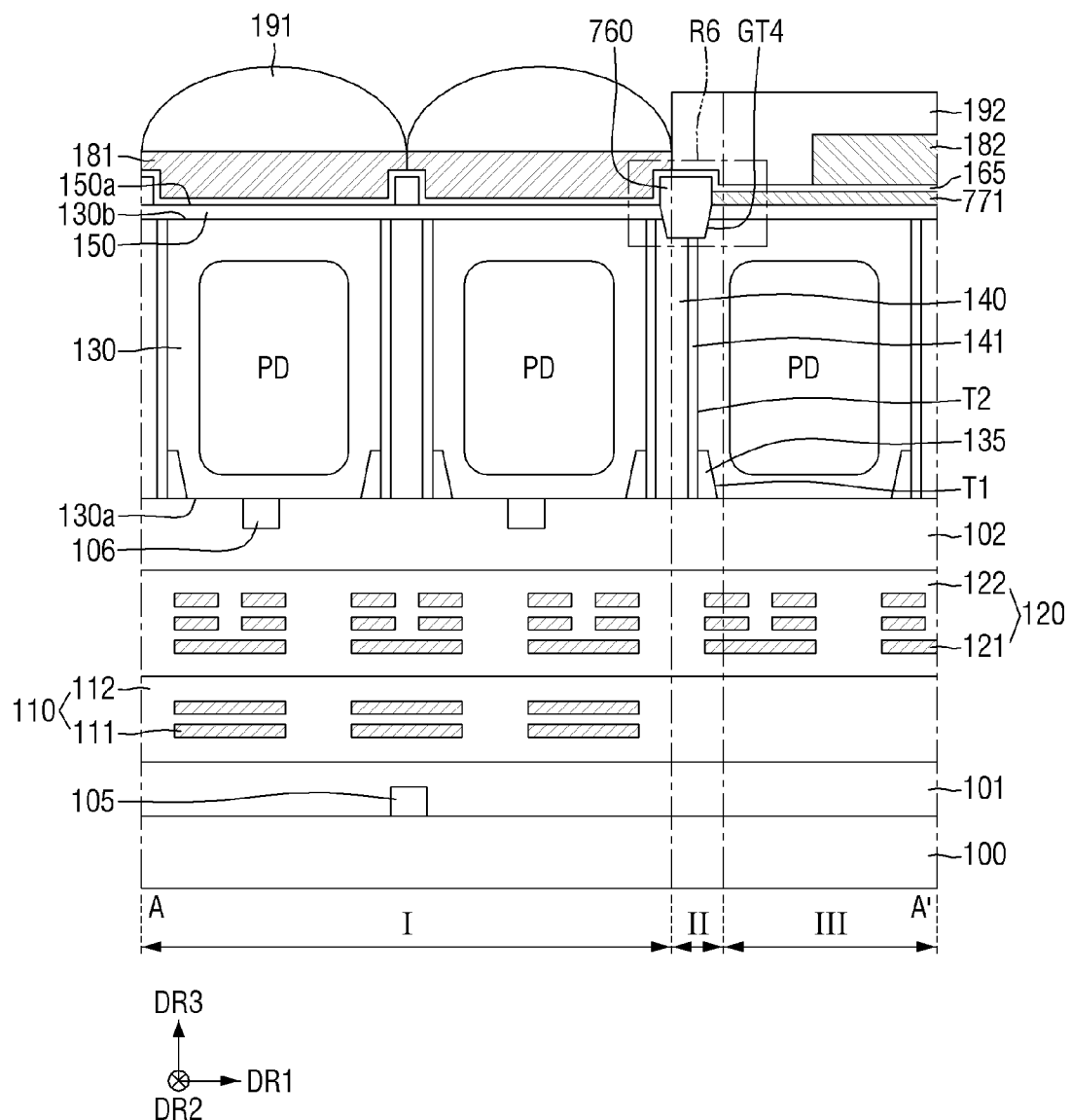
FIG. 16 is a cross-sectional view for explaining an image sensor according to some other example embodiments.

FIG. 16 is a cross-sectional view for explaining an image sensor according to some other example embodiments. FIG. 17 is an enlarged view of a region R6 of FIG. 16.

Figure 17:
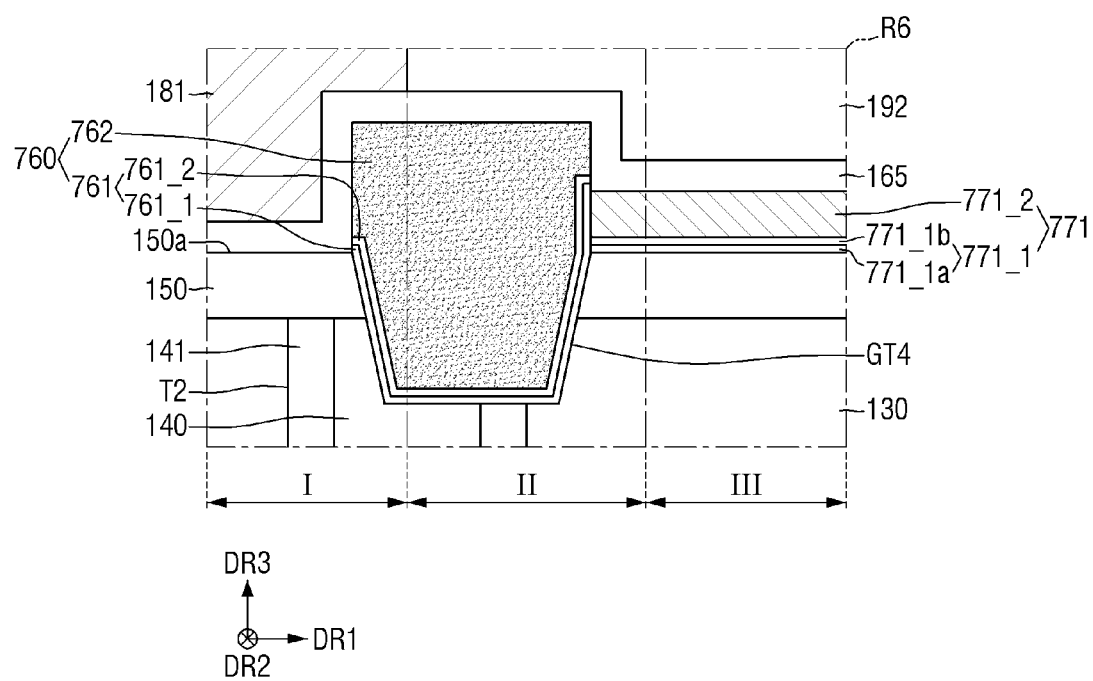
FIG. 17 is an enlarged view of a region R6 of FIG. 16.

Referring to FIGS. 16 and 17, in the image sensor according to some other embodiment of the present disclosure, a portion formed in an annular shape at the outermost edge of the grid pattern 760 may completely fill the grid trench GT4 in a plane defined by the first direction DR1 and the second direction DR2. The first conductive pattern 771 is not placed inside the grid trench GT4.

While FIG. 17 shows that the grid trench GT4 is formed over the first region I of the second substrate 130 and the boundary region II of the second substrate 130, the embodiments are not limited thereto. In some other embodiments, the grid trench GT4 may be formed only in the boundary region II of the second substrate 130.

The grid pattern 760 may include a first barrier layer 761, and a first low refractive index layer 762 placed on the first barrier layer 761. The first barrier layer 761 may include a first layer 761_1, and a second layer 761_2 placed on the first layer 761_1.

The first conductive pattern 771 may include a second barrier layer 771_1, and a metal layer 771_2 placed on the second barrier layer 771_1. The second barrier layer 771_1 may include a first layer 771_1a, and a second layer 771_1b placed on the first layer 771_1a.

Hereinafter, an image sensor according to some other embodiment of the present disclosure will be explained referring to FIG. 18. Differences from the image sensor shown in FIGS. 3 to 6 will be mainly explained.

Figure 18:
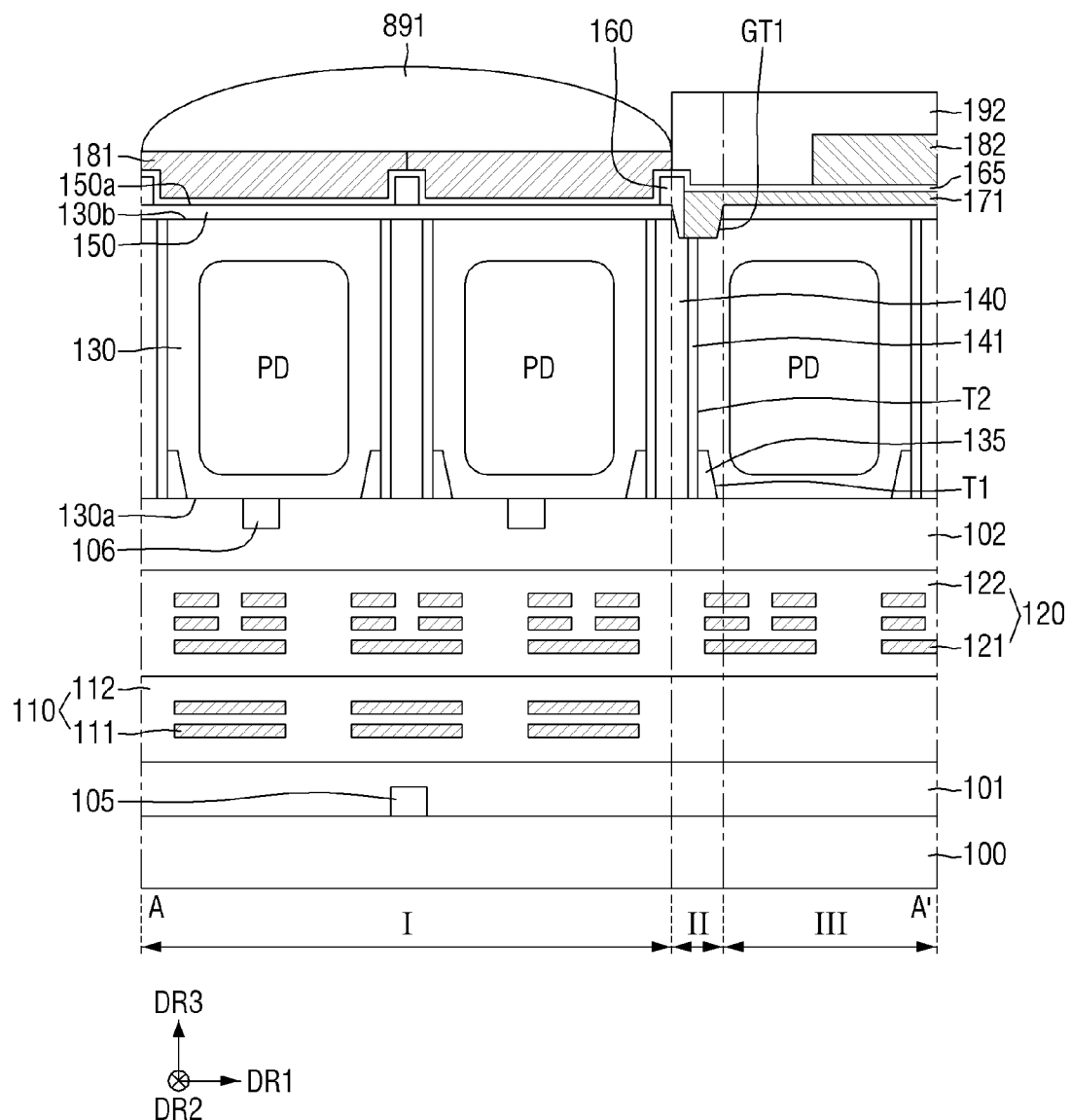
FIG. 18 is a cross-sectional view for explaining an image sensor according to some other example embodiments.

FIG. 18 is a cross-sectional view for explaining an image sensor according to some other example embodiments.

Referring to FIG. 18, the image sensor according to some other embodiment of the present disclosure may have one microlens 891 placed on two or more first color filters 181.

FIG. 18, which is a cross-sectional view, shows that one microlens 891 is placed on two first color filters 181. However, the microlens 891 may be placed on four adjacent first color filters 181 in the plane defined by the first direction DR1 and the second direction DR2. In some other embodiments, the microlens 891 may be placed on nine adjacent first color filters 181 in the plane defined by the first direction DR1 and the second direction DR2.

Hereinafter, a method for fabricating an image sensor according to some example embodiments will be explained referring to FIGS. 4, 19 to 26.

FIGS. 19 to 26 are intermediate step diagrams for explaining the method for fabricating an image sensor according to some example embodiments.

Figure 19:
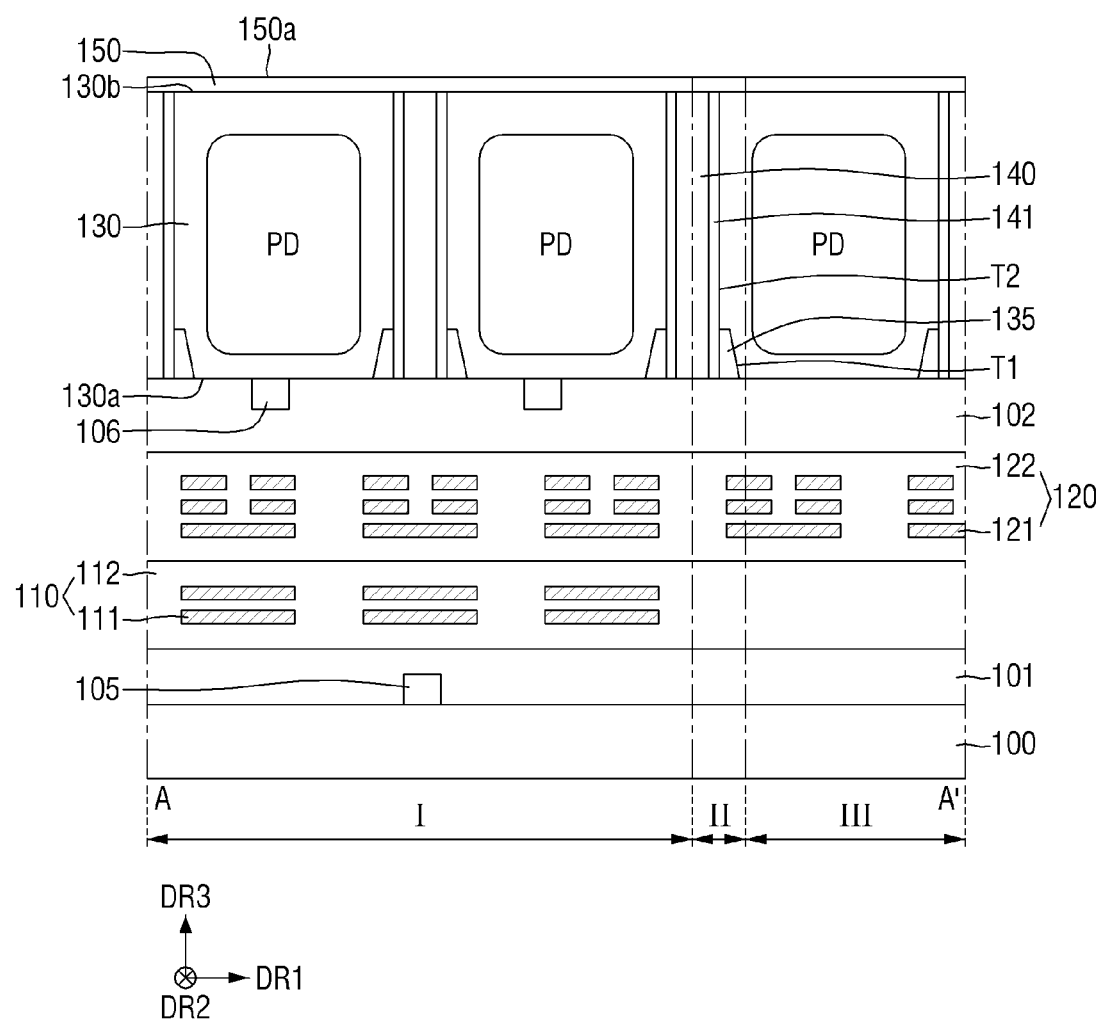
FIGS. 19 to 26 are intermediate step diagrams for explaining a method for fabricating an image sensor according to some example embodiments.

Referring to FIG. 19, a first element isolation film 135, a second element isolation film 140, a trench barrier layer 141 and a photoelectric conversion element PD may be formed inside the second substrate 130.

Subsequently, a second gate structure 106, a second insulating layer 102, a second wiring structure 120, a first wiring structure 110, a first gate structure 105, a first insulating layer 101, and a first substrate 100 may be formed on a lower side 130a of the second substrate 130.

Subsequently, a passivation layer 150 may be formed on an upper side 130b of the second substrate 130. The passivation layer 150 may be formed on the upper side 130b of the second substrate 130 conformally. However, the embodiments are not limited thereto.

Figure 20:
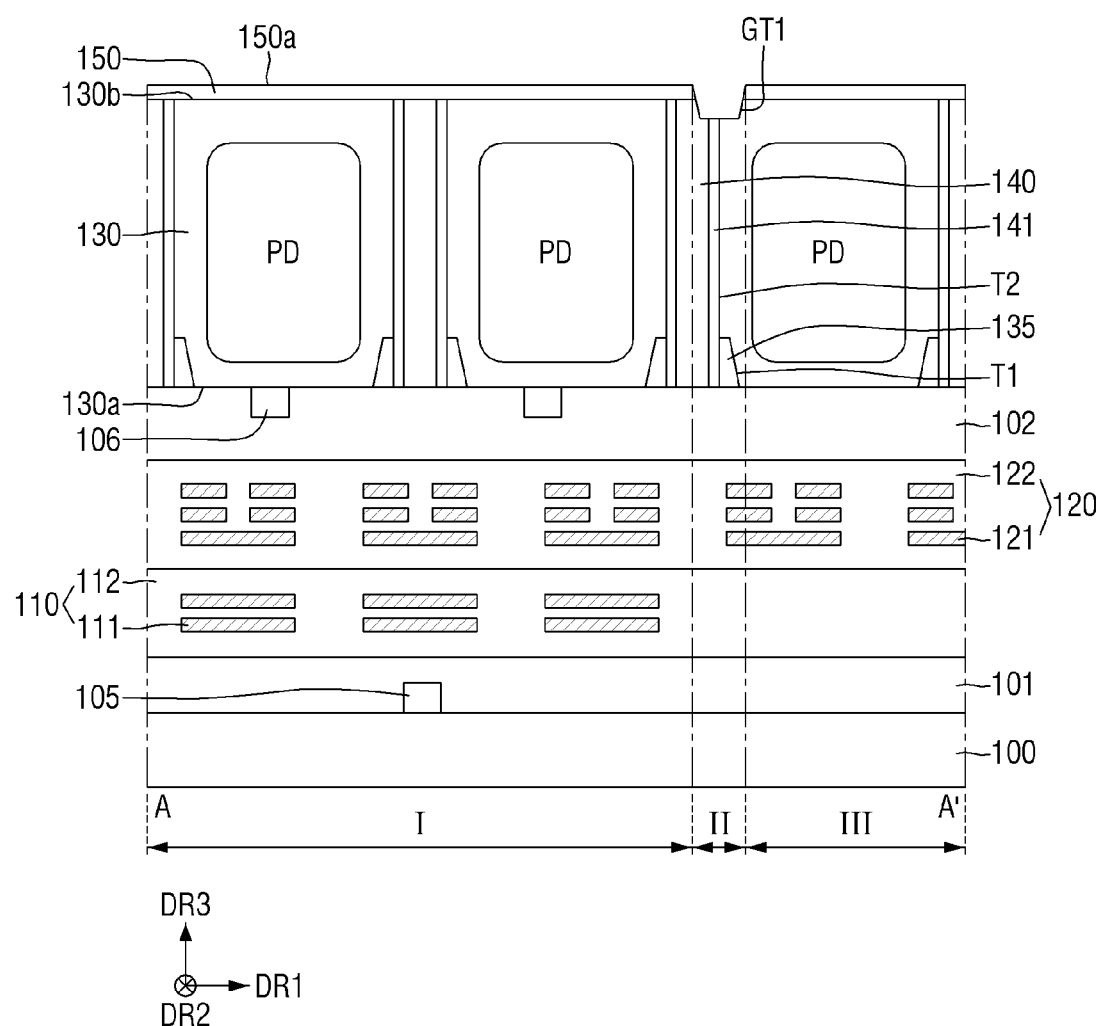

Referring to FIG. 20, a grid trench GT1 that penetrates the penetration layer 150 in the vertical direction DR3 and extends toward the inside of the second substrate 130 may be formed. The grid trench GT1 may be formed on the boundary region II of the second substrate 130.

In the process of forming the grid trench GT1, a part of the second element isolation film 140 may be etched. A part of the second element isolation film 140 may be exposed by the grid trench GT1.

Figure 21:
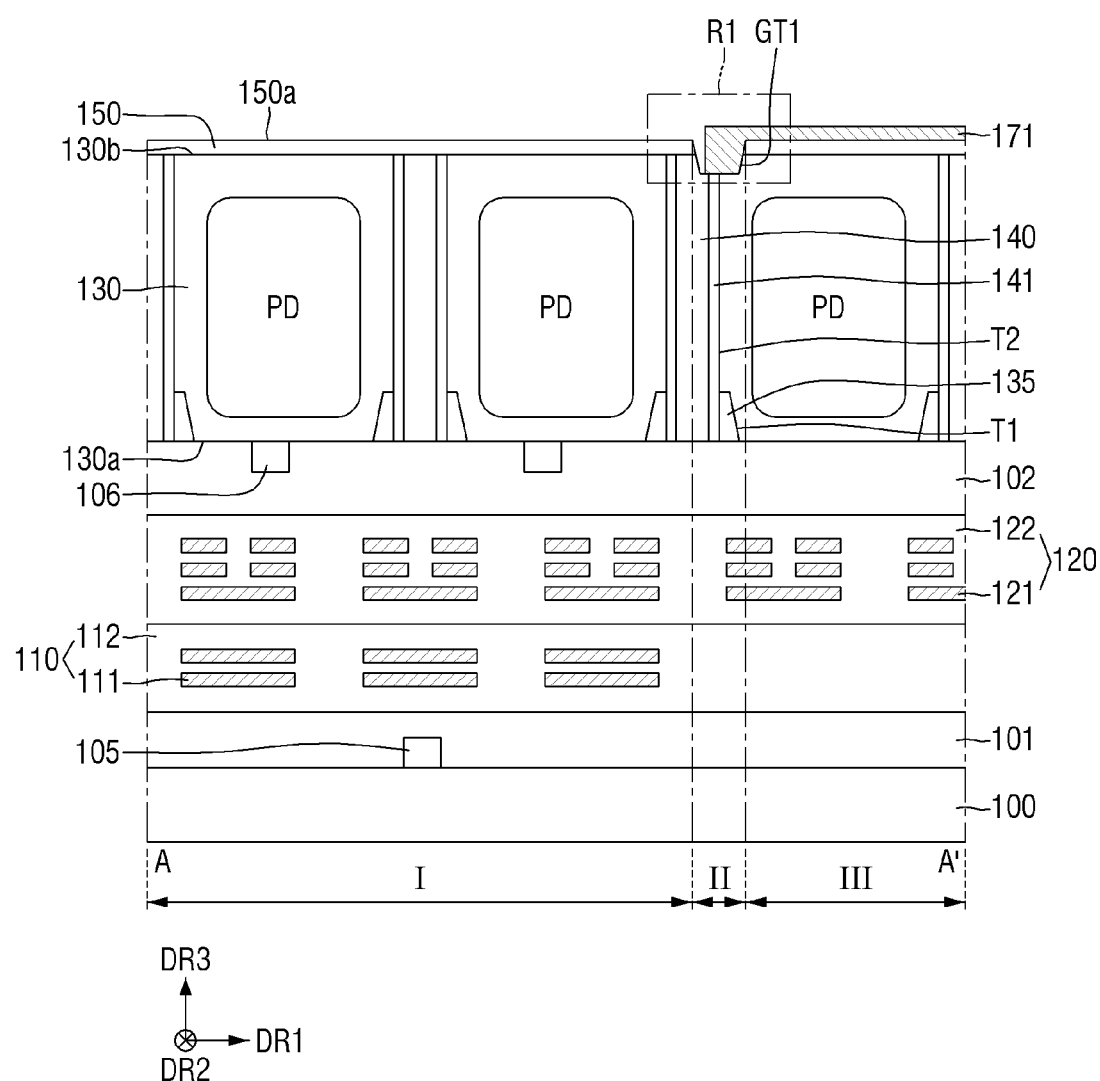
Figure 22:
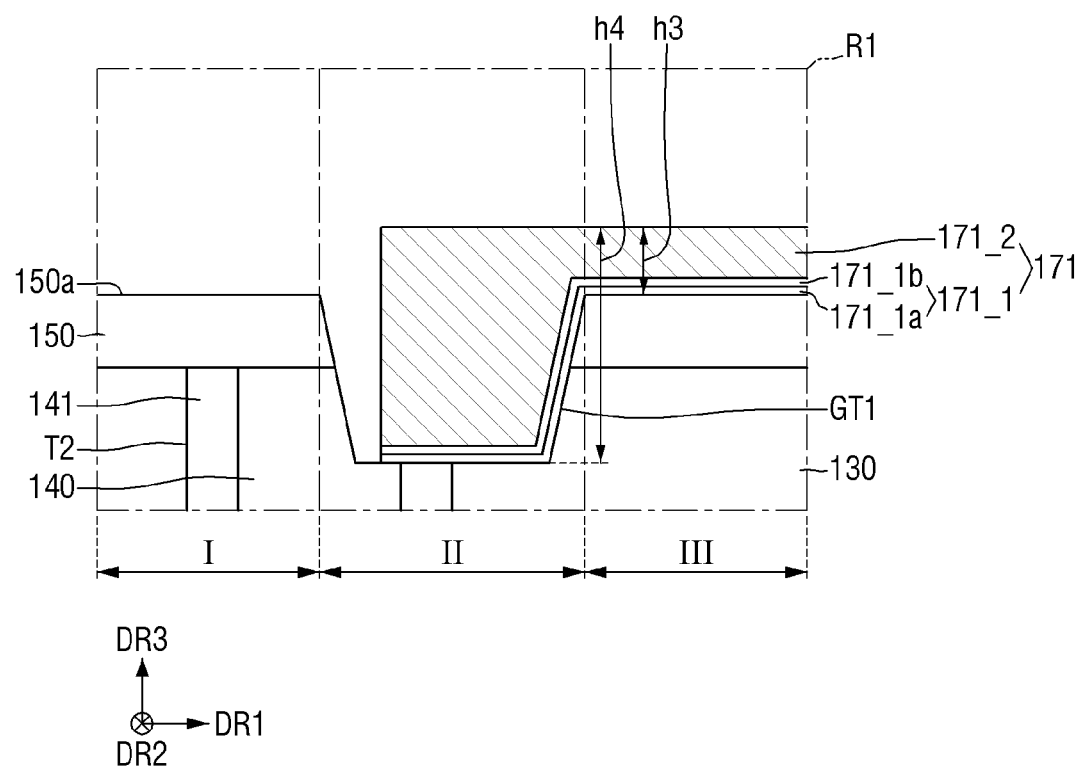

Referring to FIGS. 21 and 22, the first conductive pattern 171 may be formed on the boundary region II of the second substrate 130 and the second region III of the second substrate 130.

The first conductive pattern 171 may be formed on the upper surface 150a of the passivation layer 150 over the second region III of the second substrate 130. Also, at least a part of the first conductive pattern 171 may be formed inside the grid trench GT1. The first conductive pattern 171 may fill a part of the grid trench GT1 adjacent to the second region III of the second substrate 130.

After the second barrier layer 171_1 and the metal layer 171_2 are sequentially formed on the upper surface 150a of the passivation layer 150 and the grid trench GT1, the first conductive pattern 171 may be formed through a patterning process.

Figure 23:
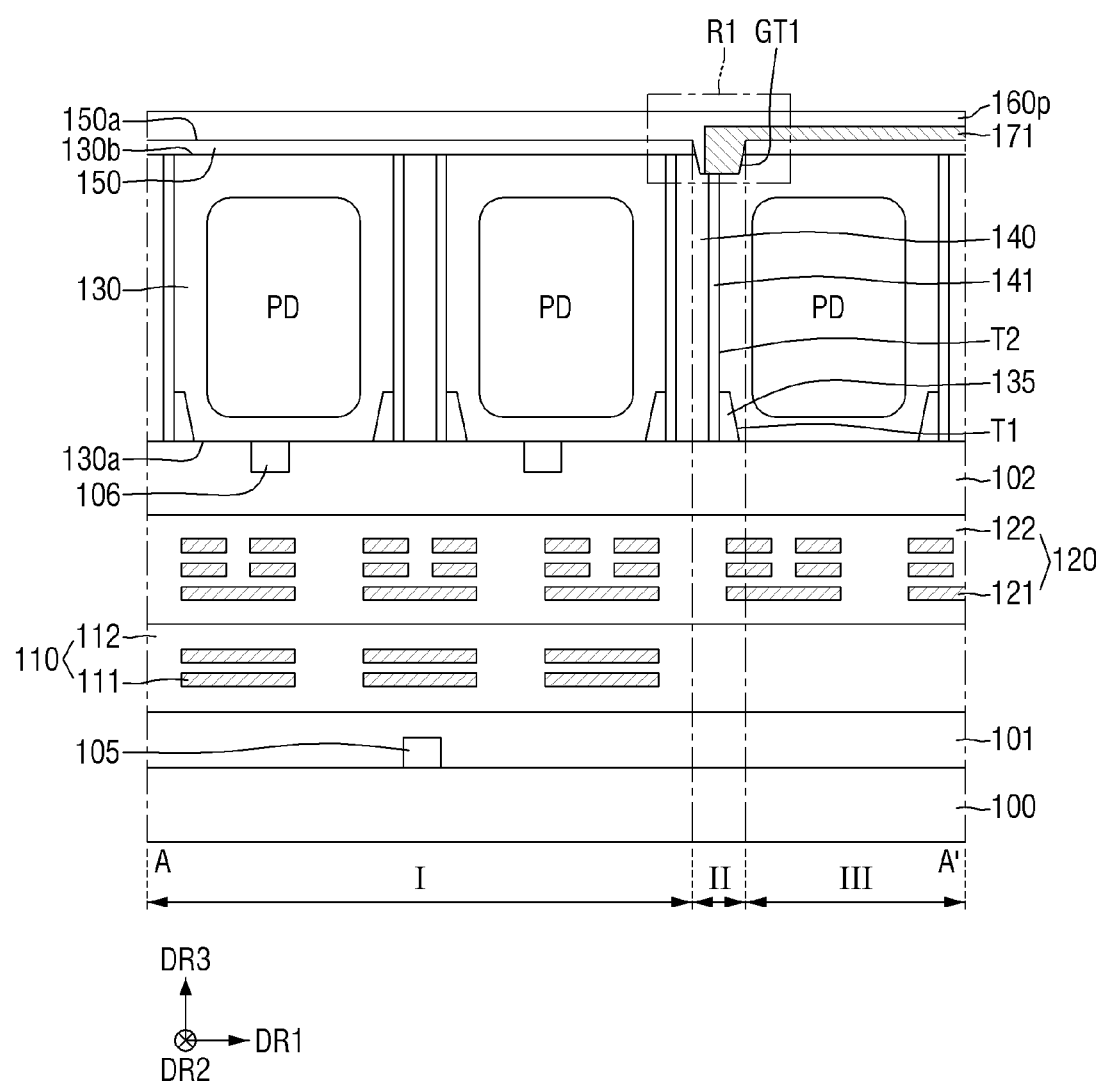
Figure 24:
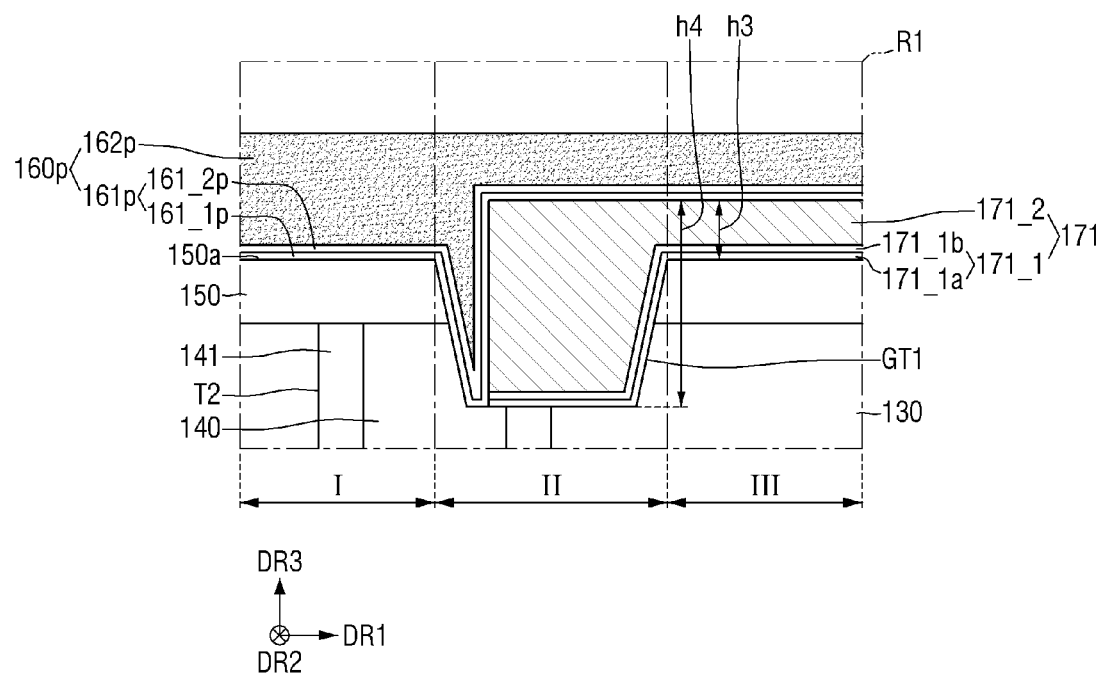

Referring to FIGS. 23 and 24, a grid layer 160p may be formed to cover the passivation layer 150 and the first conductive pattern 171. The grid layer 160p may completely fill the remaining part of the grid trench GT1.

A grid layer 161p and a first pre low refractive index layer 162p may be sequentially formed on the upper surface 150a of the passivation layer 150, the first conductive pattern 171, and the remaining part of the grid trench GT1, to form the grid layer 160p. The first pre low refractive index layer 162p may include a first pre layer 161_1p, and a first pre layer 161_2p formed on the first pre layer 161_1p.

Figure 25:
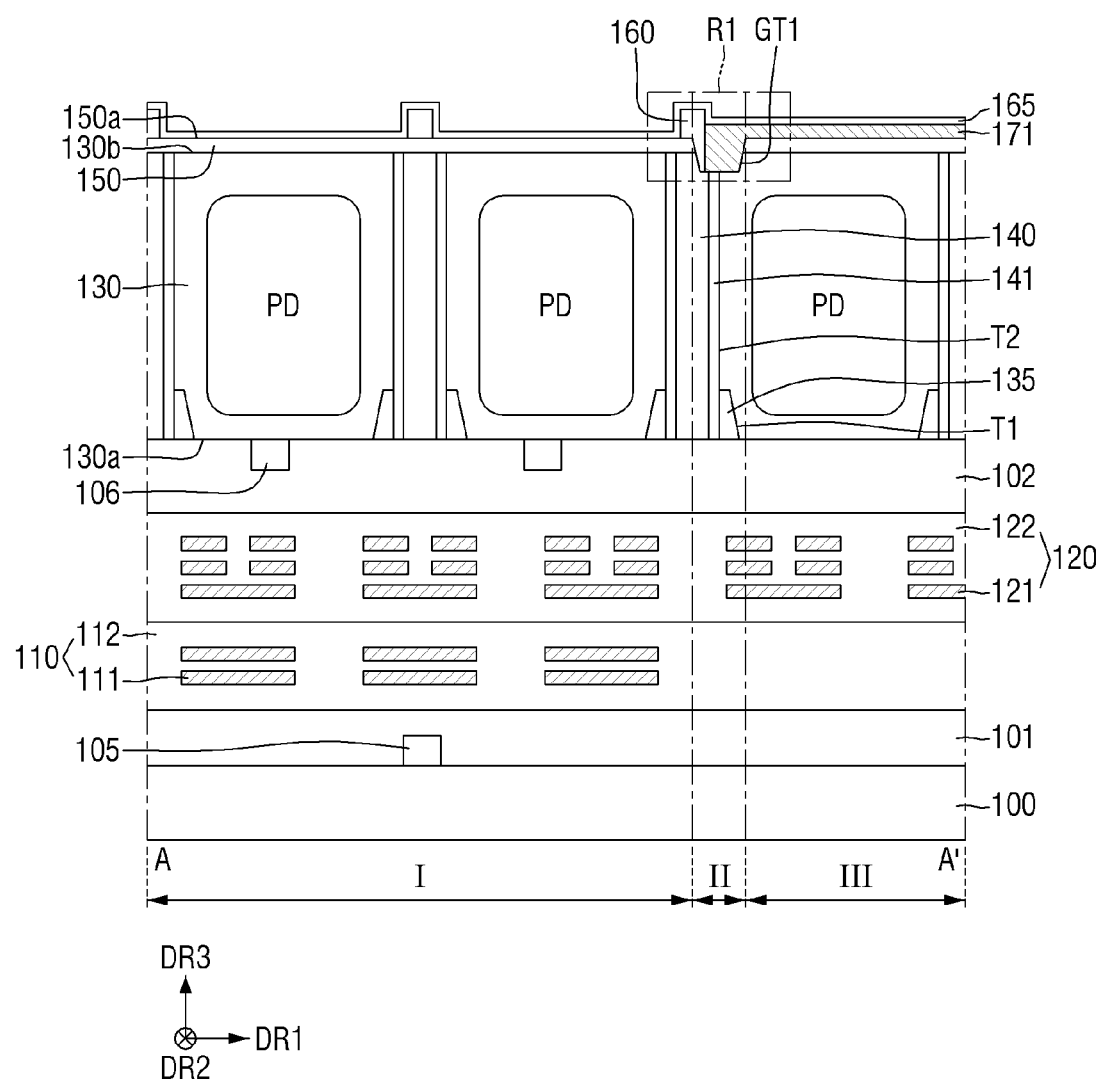
Figure 26:
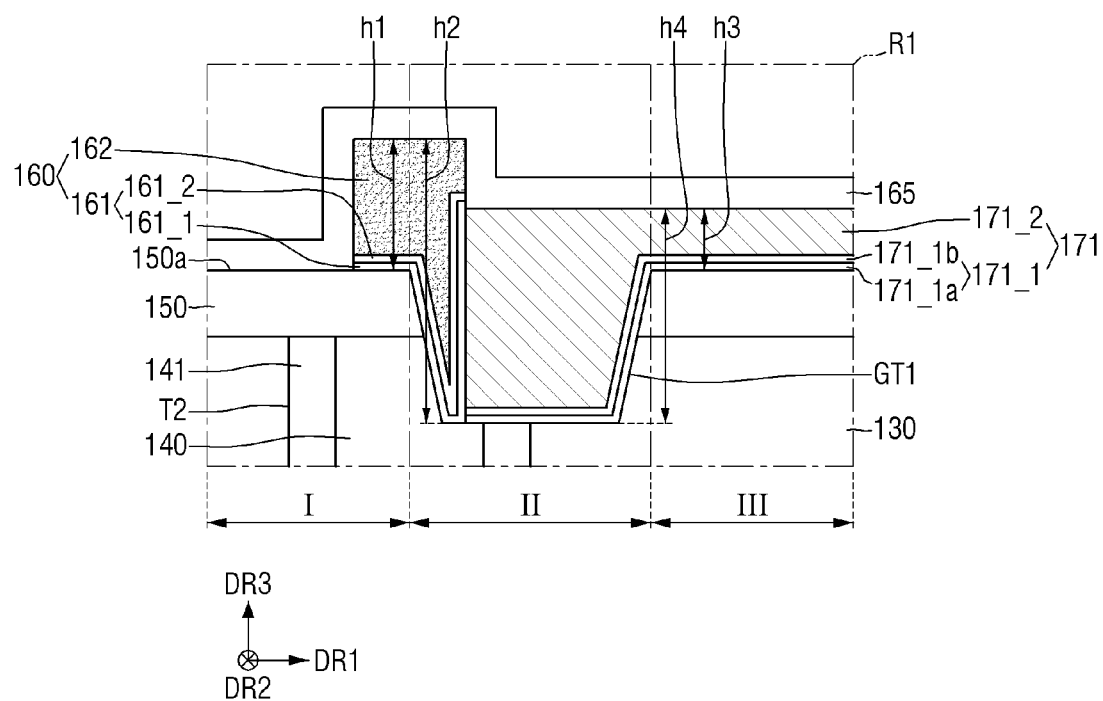

Referring to FIGS. 25 and 26, the grid layer (160p of FIG. 24) may be patterned to form the grid pattern 160 on the upper surface 150a of the passivation layer 150. At least a part of the grid pattern 160 may be formed inside the grid trench GT1.

Subsequently, a liner layer 165 may be formed on the upper surface 150a of the passivation layer 150, the upper surface of the first conductive pattern 171, and the grid pattern 160. The liner layer 165 may be formed, for example, conformally; however, the embodiments are not limited thereto.

Referring to FIG. 4, on the liner layer 165 formed on the first region I of the second substrate 130, the first color filter 181 may be formed between the grid patterns 160. Also, the second color filter 182 may be formed on the liner layer 165 formed on the second region III of the second substrate 130.

Subsequently, a microlens 191 may be formed on the first color filter 181. Also, the transparent layer 192 may be formed to cover the liner layer 165 and the second color filter 182 on the second region III of the second substrate 130.

While the disclosure has been particularly shown and described with reference to example embodiments thereof, it will be understood that various changes in form and details may be made therein without departing from the spirit and scope of the following claims.

What is claimed is:

1. An image sensor comprising:
a substrate including an active pixel sensor region, an optical black sensor region, and a boundary region provided between the active pixel sensor region and the optical black sensor region;
a photoelectric conversion element provided inside the substrate on the boundary region;
a passivation layer provided on the substrate;
a grid trench formed on the boundary region of the substrate, the grid trench comprising an inclined surface that extends from an upper surface of the passivation layer toward an inside of the passivation layer;
grid patterns, each of grid patterns being provided on the passivation layer on each of the active pixel sensor region and the boundary region of the substrate, at least a part of a grid pattern being provided inside the grid trench on the inclined surface such that a cross section view of the at least a part of the grid pattern includes a triangular shaped portion; and
a color filter provided between the grid patterns.

2. The image sensor of claim 1, wherein the grid pattern includes a first barrier layer, and a low refractive index layer provided on the first barrier layer.

3. The image sensor of claim 1, further comprising
a conductive pattern provided on the passivation layer on the boundary region of the substrate and the optical black sensor region of the substrate, the conductive pattern being in contact with the grid pattern.

4. The image sensor of claim 3, wherein at least a part of the conductive pattern is provided inside the grid trench.

5. The image sensor of claim 3, wherein the conductive pattern includes a second barrier layer, and a metal layer provided on the second barrier layer.

6. The image sensor of claim 3, wherein at least a part of the conductive pattern is provided below the grid pattern inside the grid trench.

7. The image sensor of claim 1, wherein the grid trench extends into an inside of the substrate.

8. The image sensor of claim 7, further comprising:
an element isolation film provided between photoelectric conversion elements inside the substrate,
wherein the grid pattern is provided inside the grid trench being in contact with the element isolation film.

9. The image sensor of claim 1, wherein a first height in a vertical direction of the grid pattern provided on the upper surface of the passivation layer is smaller than a second height in the vertical direction of the grid pattern which overlaps the grid trench in the vertical direction.

10. The image sensor of claim 1, wherein the grid pattern, which is provided at an outermost part of the active pixel sensor region of the substrate and the boundary region of the substrate, completely fills the grid trench.

11. An image sensor comprising:
a substrate;
a photoelectric conversion element provided inside the substrate;
a passivation layer provided on the substrate;
a grid trench extending from an upper surface of the passivation layer toward an inside of the substrate;
a grid pattern provided on the passivation layer and at least partially provided inside the grid trench; and
a conductive pattern provided on the passivation layer and at least partially provided inside the grid trench, the conductive pattern being in contact with a side wall of the grid pattern,
wherein a first height in a vertical direction of the grid pattern provided on the upper surface of the passivation layer is smaller than a second height in the vertical direction of the grid pattern which overlaps the grid trench in the vertical direction, and
wherein an upper surface of the grid pattern is at a level higher than an upper surface of the conductive pattern.

12. The image sensor of claim 11, wherein the conductive pattern is in contact with the substrate inside the grid trench.

13. The image sensor of claim 11, wherein a third height in the vertical direction of the conductive pattern provided on the upper surface of the passivation layer is smaller than a fourth height in the vertical direction of the conductive pattern which overlaps the grid trench in the vertical direction.

14. The image sensor of claim 11, further comprising:
a color filter provided between grid patterns; and
a microlens provided on the color filter.

15. The image sensor of claim 11, wherein the grid pattern includes a first barrier layer, and a low refractive index layer provided on the first barrier layer.

16. The image sensor of claim 15, wherein the first barrier layer is provided between the low refractive index layer and the conductive pattern.

17. The image sensor of claim 11, further comprising:
an element isolation film provided between photoelectric conversion elements inside the substrate,
wherein the grid pattern provided inside the grid trench is in contact with the element isolation film.

18. The image sensor of claim 17, wherein the conductive pattern provided inside the grid trench is in contact with the element isolation film.

19. The image sensor of claim 11, wherein at least a part of the conductive pattern is provided below the grid pattern inside the grid trench.

20. An image sensor comprising:
a substrate including an active pixel sensor region, an optical black sensor region, and a boundary region provided between the active pixel sensor region and the optical black sensor region;
a photoelectric conversion element provided inside the substrate on the boundary region;
a passivation layer provided on the substrate;
a grid trench formed on the boundary region of the substrate, the grid trench comprising an inclined surface that extends from an upper surface of the passivation layer toward an inside of the substrate;
a grid pattern provided on the passivation layer on each of the active pixel sensor region of the substrate and the boundary region of the substrate, at least a part of the grid pattern being provided inside the grid trench on the inclined surface such that a cross section view of the at least a part of the grid pattern includes a triangular shaped portion;

a conductive pattern provided on the passivation layer on each of the boundary region and the optical black sensor region of the substrate, the conductive pattern being at least partially provided inside the grid trench, and being in contact with a side wall of the grid pattern;

a color filter provided between grid patterns and provided on the active pixel sensor region of the substrate;

a microlens provided on the color filter; and an element isolation film provided between photoelectric conversion elements inside the substrate, the element isolation film being in contact with the grid pattern, wherein a first height in a vertical direction of the grid pattern provided on the upper surface of the passivation layer is smaller than a second height in the vertical direction of the grid pattern which overlaps the grid trench in the vertical direction.

* * * * *